United States Patent [19]
Blake et al.

[11] Patent Number: 5,811,823
[45] Date of Patent: Sep. 22, 1998

[54] CONTROL MECHANISMS FOR DOSIMETRY CONTROL IN ION IMPLANTATION SYSTEMS

[75] Inventors: Julian G. Blake, Beverly Farms; Piero Sferlazzo, Lynnfield, both of Mass.; Peter H. Rose, N. Conway, N.H.; Adam A. Brailove, Glouchester, Mass.

[73] Assignee: Eaton Corporation, Cleveland, Ohio

[21] Appl. No.: 757,726

[22] Filed: Nov. 26, 1996

Related U.S. Application Data

[63] Continuation of Ser. No. 601,983, Feb. 16, 1996, abandoned.

[51] Int. Cl.$^6$ .................................................. H01J 37/30
[52] U.S. Cl. .................................. 250/492.21; 250/397
[58] Field of Search ........................... 250/492.21, 397, 250/398

[56] References Cited

U.S. PATENT DOCUMENTS

| | | | |
|---|---|---|---|
| 3,778,626 | 12/1973 | Robertson | 250/492 |
| 3,954,191 | 5/1976 | Wittkower | 214/17 |
| 4,228,358 | 10/1980 | Ryding | 250/457 |
| 4,229,655 | 10/1980 | Ryding | 250/400 |
| 4,234,797 | 11/1980 | Ryding | 250/492 |
| 4,258,266 | 3/1981 | Robinson et al. | 250/492 |
| 4,346,301 | 8/1982 | Robinson et al. | 250/492 |
| 4,433,951 | 2/1984 | Koch et al. | 414/217 |
| 4,494,005 | 1/1985 | Shibata et al. | 250/492.21 |
| 4,514,637 | 4/1985 | Dykstra et al. | 250/397 |
| 4,517,465 | 5/1985 | Gault et al. | 250/492.2 |
| 4,539,217 | 9/1985 | Farley | 427/10 |
| 4,550,239 | 10/1985 | Uehara et al. | 219/121 |
| 4,553,069 | 11/1985 | Purser | 315/111.81 |
| 4,568,234 | 2/1986 | Lee et al. | 414/404 |
| 4,587,433 | 5/1986 | Farley | 250/492.2 |
| 4,705,951 | 11/1987 | Layman et al. | 250/442.1 |
| 4,745,287 | 5/1988 | Turner | 250/492.2 |
| 4,836,733 | 6/1989 | Hertel et al. | 414/225 |
| 4,899,059 | 2/1990 | Freytsis et al. | 250/492.2 |
| 4,911,103 | 3/1990 | Davis et al. | 118/725 |
| 4,917,556 | 4/1990 | Stark et al. | 414/217 |
| 5,229,615 | 7/1993 | Brune et al. | 250/492.2 |
| 5,278,420 | 1/1994 | Sugiyama | 250/492.21 |
| 5,308,989 | 5/1994 | Brubaker | 250/441.11 |
| 5,319,212 | 6/1994 | Tokoro | 250/492.21 |
| 5,393,986 | 2/1995 | Yoshinouchi et al. | 250/492.21 |
| 5,404,894 | 4/1995 | Shiraiwa | 134/66 |
| 5,478,195 | 12/1995 | Usami | 414/786 |
| 5,486,702 | 1/1996 | O'Connor et al. | 250/492.21 |
| 5,554,853 | 9/1996 | Rose | 250/492.21 |

FOREIGN PATENT DOCUMENTS

| | | |
|---|---|---|
| 398270A | 11/1990 | European Pat. Off. . |
| 428319A | 5/1991 | European Pat. Off. . |
| 431757A | 6/1991 | European Pat. Off. . |

OTHER PUBLICATIONS

"A High Resolution Beam Profile Measuring System for High–Current Ion Implanters", Nuclear Instrucments & Methods in Physics Researc, Section–B: Beam Interactions with Materials and Atoms, vol. B55, No. 1/04, 2 Apr. 1991.

*Primary Examiner*—Bruce Anderson
*Attorney, Agent, or Firm*—Thomas J. Engellenner; Anthony A. Laurentano; Lahive & Cockfield, LLP

[57] ABSTRACT

A high throughput ion implantation system that rapidly and efficiently processes large quantities of flat panel displays. The ion implantation system has an ion source, an electrode assembly, a platform mounting a workpiece, and a ion beam measuring structure. The ion source in conjunction with the electrode assembly forms an ion beam in the shape of a ribbon beam. The ion beam is formed and directed such that a first portion of the ion beam treats the workpiece while a second portion of the ion beam is contemporaneously measured by the beam measuring structure. A controller obtains data from the beam measuring structure on the ion beam's parameters, and then generates control signals to the ion implantation system in response to the data.

37 Claims, 13 Drawing Sheets

Read W,D,Jmax,Jmin,Vmax,Nmax,Nmin,f,E,Ns,DT,Cg,Rg FROM INPUT struct.
Calculate max,min sub dose./* used in deciding success status */ thru_put_max=0
for n=Nmin to Nmax
  {
      Dn=D/n /*sub dose*/
Calculate Vcrit = W*Ns*[f*Cg*DT/Dn/E/q-1]/alpha/TAOg
      /*Vcrit is the (DT) temperature-limited maximum scan speed
   at   which this sub dose could be implanted given unlimited
      beam current density and unlimited scan speed. */
      if Vcrit>Vmax
            Vscan=Vmax
      else if Vcrit<Vmin
            Vscan=Vmin
      else
            Vscan=Vcrit
      Calculate J=Dn*Vscan*q/f/Ns /* necessary beam current density
*/ if J>Jmax
            {
            recalculate Vscan=Jmax*f*Ns/Dn/q
            J=Jmax
            }
      if J<Jmin
            {
            recalculate Vscan=Jmin*f*Ns/Dn/q
            J=Jmin
            }
      delta_T=Dn*E*q*[1+alpha*TAOg*Vscan/Ns/W]/Cg/f
      if (Vscan>Vmin) and (Vscan<Vmax) and (Vscan<Vcrit)
            {
            Calculate thru_put= (1/handling_time+implant_time)
            *n)) if thru-put>max_thru_put
               {
                  max_thru_put=thru_put
                  store_best conditions
               }
            }
      }
If max_thru_put !=0
      set success_code accordingly
else
      set success_code according to which parameter restrictions or requirements need to be relaxed.
Write parameters to results struct.
return

*FIG. 16*

CONTROL MECHANISMS FOR DOSIMETRY CONTROL IN ION IMPLANTATION SYSTEMS

REFERENCE TO RELATED APPLICATIONS

The current application is a continuation-in-part of and incorporates by reference the commonly-owned, U.S. patent application No. 08/601,983, for ION IMPLANTATION SYSTEM FOR FLAT PANEL DISPLAYS, filed on Feb. 16, 1996, abandoned.

This application is also related to and incorporates by reference the following commonly assigned U.S. patent applications Ser. Nos. 08/756,972, for METHODS AND APPARATUS FOR COOLING WORKPIECES, filed the same day herewith;

U.S. application Ser. No. 08/756,656, for LARGE AREA UNIFORM ION BEAM FORMATION, filed the same day herewith; Ser. No. 08/756,97, METHODS AND APPARATUS FOR CONTROLLING HYDROGEN DOSAGE DURING ION IMPLANTATION, filed the same day herewith;

U.S. application Ser. No. 08/753,514, for ION SOURCE SHIELDS, filed the same day herewith;

U.S. application Ser. No. 08/756,133, for ION IMPLANTATION SYSTEM FOR IMPLANTING WORKPIECES, filed the same day herewith; and U.S. application Ser. No. 08/756,372, for LOADLOCK ASSEMBLY FOR ION IMPLANTATION, filed the same day herewith now abandoned.

BACKGROUND OF THE INVENTION

The present invention relates to ion implantation systems for large area workpieces and to systems for accurately controlling the implant dosage of large area workpieces. In particular, the invention concerns feedback control mechanisms used in conjunction with large area ion beams for accurately controlling the implant dosage of large area workpieces.

Ion implantation has become a standard, commercially accepted technique for introducing conductivity-altering dopants into a workpiece, such as a semiconductor wafer or glass substrate, in a controlled and rapid manner. Conventional ion implantation systems include an ion source that ionizes a desired dopant element which is then accelerated to form an ion beam of prescribed energy. This beam is directed at the surface of the workpiece. Typically, the energetic ions of the ion beam penetrate into the bulk of the workpiece and are embedded into the crystalline lattice of the material to form a region of desired conductivity. This ion implantation process is typically performed in a high vacuum, gas-tight process chamber which encases a wafer handling assembly and the ion source. This high vacuum environment prevents dispersion of the ion beam by collisions with gas molecules and also minimizes the risk of contamination of the workpiece by airborne particulates.

The process chamber is typically coupled via a valve assembly with an automated wafer handling and processing end station. The end station can include an intermediate chamber or pressure lock, known generally as a loadlock chamber, which can be pumped down from atmospheric pressure by a vacuum pumping system. This chamber preferably communicates at one end with an end effector which transfers the workpieces from one or more cassettes to the intermediate chamber. Once a workpiece has been loaded into the intermediate chamber by the end effector, the chamber is evacuated via the pump to a high vacuum condition compatible with the process chamber. A valve at the downstream end of the intermediate chamber then opens and the wafer handling assembly mounted within the process chamber removes the workpiece from the chamber. After the workpiece is positioned in the chamber, it can be implanted by the ion source.

The typical ion beam path in prior art ion implantation systems include an ion source, electrodes, an analyzing magnet arrangement, an optical resolving element, and a wafer processing system. The electrodes extract and accelerate ions generated in the ion source to produce a beam directed towards the analyzing magnet arrangement. The analyzing magnet arrangement sorts the ions in the ion beam according to their charge-to-mass ratio, and the wafer processing system adjusts the position of the workpiece along two axes relative to the ion beam path.

In particular, as each individual ion leaves the electrodes and enters the analyzing magnets, its line of flight is bent into a path having a radius proportional to the square root of the mass of the ion. A resolving slit in the analyzing magnet arrangement, in conjunction with the optical resolving element, focus ions having a selected charge-to-mass ratio so that the ions are directed towards the workpiece. Ions not having the selected charge-to-mass ratio are focused either to the left or to the right of the resolving slit and are selected out of the final ion beam striking the target workpiece.

The selected ions exiting the analyzing magnet and optical resolving element arrangement are then generally moved across the workpiece in a controlled manner to spread the particles across the workpiece. In doping semiconductor wafers, a common technique is to move the wafers relative to a fixed beam of selected ions along two orthogonal directions. The wafers are supported on a moving surface, which moves them at high speed along a scanning direction and at a slower speed along an orthogonal direction. To achieve uniform doping density, it is conventional to measure the beam intensity and to vary the speed of the wafer in response to the measured beam intensity. For instance, a wafer controller can be included that increases the speed of the wafer when the intensity of the ion beam on the wafer increases, and decreases the speed of the wafer when intensity of the ion beam decreases.

Robertson, U.S. Pat. No. 3,778,626, measures the current flowing to or from a disc-shaped wafer support element between wafer implants to determine the beam intensity. The disc-shaped support element is electrically isolated from the rest of the apparatus, and a current measuring lead is connected to the wafer support element via a complicated design that includes a slip-ring. The measured current is supplied to a control system that also senses the radial displacement of the disc-shaped wafer support element relative to the ion beam. The control system then directs the radial motion of the disc to control ion distribution.

Ryding, U.S. Pat. No. 4,234,797, employs a current measurement arrangement that uses, instead of slip rings, a Faraday detector mounted behind a wafer support disk and located to receive pulses of the beam current when an aperture in the rotating disk exposes the cage to the ion beam. As the disk spins, a sample of the beam passes through the aperture once every revolution, and strikes the Faraday detector. The samples of beam current measured during each disk revolution are fed to control electronics. The Ryding technique employs the measured beam current to control the radial velocity of the rotating disk for the purposes of achieving a uniform ion dosage.

Robinson, et al. U.S. Pat. No. 4,258,266, discloses a similar ion implantation control system in which a ribbon shaped ion beam is directed at a wafer wheel. The wafer wheel supports a plurality of wafers that are successively moved past the ribbon beam. To provide measurements of the ion beam, the wafer wheel has an aperture that permits the main beam to pass through the wafer wheel and impact a Faraday cup positioned below the aperture in the wafer wheel.

Today's burgeoning semiconductor and implantation technology has found widespread acceptance in the marketplace. With this acceptance has come demands for generating large quantities of implanted articles at competitive prices. A common goal of most modem implantation systems is to satisfy these demands by increasing the throughput of the system. Presently existing systems, however, are not well suited to meet these manufacturing and cost demands.

Prior art dosimetry control systems are particularly ill-suited for the task of forming large area flat panels. For instance, many prior art systems reduce throughput by taking time out of the implantation process to measure parameters of the ion beam. These systems typically measure parameters of the ion beam after a predetermined number of workpieces have been treated by the ion beam, thereby reducing the total time during which workpieces are being treated. Furthermore, obtaining only intermittent measurements of the parameters of the ion beam fails to provide for current updates on time sensitive parameters of the ion beam.

Accordingly, it is an object of the invention to provide an improved ion implantation system that exhibits high throughput for large area flat panel workpieces. An ion implantation system capable of rapidly producing high volumes of flat panel displays represents a major improvement in the art.

SUMMARY OF THE INVENTION

The ion implantation system of the present invention achieves increased throughput by measuring the parameters of the ion beam while contemporaneously treating a workpiece with the ion beam. The term parameters refers to those characteristics of the ion beam relevant to the implantation of ions in a workpiece, such as the current density of the ion beam, the number of neutral particles in the ion beam, and the mass of particles in the ion beam. In contrast to prior art techniques that intermittently measured the current density of the ion beam between the implantation of a predetermined number of workpieces, the disclosed invention takes measurements of the ion beam during the implantation of the workpiece. Accordingly, the ion beam of the present invention can be constantly engaged in implanting workpieces without wasting implantation time on obtaining ion beam measurements.

These results are obtained with an ion beam system having an ion source producing an ion beam and an electrode assembly directing the ion beam towards the targeted workpiece. The system further includes platform that holds the workpiece undergoing treatment. The platform is oriented relative to the ion beam such that a first portion of the ion beam impacts and treats the targeted workpiece and such that a second portion of the ion beam extends beyond the edge of the workpiece. Further in accord with the invention, the system includes a beam measuring system oriented relative to the platform so that the second portion of the ion beam impacts the beam measuring system while the workpiece is being treated by the first portion of the ion beam. The beam measuring system detects parameters of the ion beam.

The ion implantation system of the present invention also achieves increased throughput by forming a ribbon beam from an electrode having an aspect ratio that exceeds fifty to one. In particular, the ion source includes an ion chamber containing a plasma, and a plasma electrode engaging an opening in wall of the ion chamber. The plasma electrode is fashioned as an elongated slot having a length at least fifty times longer than the width of the slot. The elongated plasma electrode shapes the stream of ions exiting the ion chamber. Additionally, the ion implantation system includes an electrode assembly downstream of the plasma electrode. The electrode assembly directs the stream of ions exiting the ion chamber through the plasma electrode towards the workpiece. The stream of ions directed towards the workpiece form a ribbon beam.

The term "ribbon beam" as used herein includes an elongated ion beam having a length that extends along an axis of elongation and having a width that extends along a second path transverse to the elongation axis. Ribbon beams prove effective in implanting large area workpieces because they can reduce the number of passes of the workpiece through the ion beam required to obtain a pre-selected dosage. For instance, prior art techniques required that the ion beam be scanned in two orthogonal directions over the workpiece to completely cover the workpiece. In comparison, when a ribbon beam has a length that exceeds at least one dimension of the workpiece, only one scan of the workpiece through the ribbon beam is required to completely cover the workpiece. The workpiece is typically scanned in a direction parallel to the short axis of the ribbon beam. Ribbon beams formed from electrodes having even higher aspect ratios of 100:1 may be needed to implant larger workpieces, such as workpieces having dimensions of 550 mm by 650 mm and larger. Ribbon beams having aspect ratios of 100:1 prove more difficult to control and to keep uniform.

In those ion implantation systems utilizing a ribbon beam, the invention can further include a Faraday slot positioned in the beam path for measuring current density of the ion beam. The Faraday slot is typically oriented so that it extends along a path substantially transverse to the elongated axis of the ribbon beam. The Faraday slot can also be structured so that the length of the Faraday slot exceeds the shorter dimension of the ribbon beam at the faraday slot. This allows the Faraday slot, when properly oriented, to measure the total current density of the ribbon beam along an individual strip that traverses the entire width of the ribbon beam. Accordingly, this Faraday slot provides a measurement of the total current generated by the ribbon beam along the particular strip being measured.

Faraday detectors can also be structured to identify "hot spots" (i.e. areas of high current density) throughout the ion beam. For example, a Faraday detector can be mounted upon a moveable support assembly capable of translating the detector throughout the path of the ion beam. In another aspect, the ion beam system can include an array of Faraday detectors positioned along the length or width of the ion beam for identifying "hot spots" or trends in the current density of the ion beam. Characterization of the ion beam can be achieved during start-up procedures, during workpiece treatment procedures, during ion beam maintenance procedures, or simply during the time period between implantation of the individual workpieces.

Another aspect of the invention provides for a moveable platform that mounts the workpiece and that moves the workpiece through the path of the ion beam. Further in accordance with this aspect of the invention, the beam measuring system is stationarily positioned within the beam path so that beam parameters can be measured while the workpiece is moved through the ion beam. The moveable platform can be formed of various structures, including a robot pick up arm that supports the workpiece and is extendible through the beam path. Other embodiments of the platform include a moveable table mounted to parallel rails, a wheel supported by and rotating about an axle, and endless belt movably mounted around two or more substantially parallel rollers.

The moveable platform aspect of the invention can also include a motor mechanically coupled with the platform. The motor provides the required force to move the platform through the ion beam. Preferably, the motor is operable at a variable speed for moving the workpiece through the ion beam at a variable velocity. A motor controller can be coupled with the beam measuring system and with the motor. The motor controller interprets the data coming from the beam measuring system and generates a motor control signal to the motor in response to the measured parameters of the ion beam. The motor control signal dictates the speed of the motor, thereby controlling the velocity of the workpiece relative to the ion beam.

Other features of the invention provide for specific detectors that form the beam measuring system. One such detector is a neutral beam detector designed for measuring the density and number of neutral atoms in the ion beam. Another detector is a mass analyzer positioned in the beam path for measuring the mass of particles in the ion beam. While a third detector is a Faraday detector positioned in the path of the ion beam for measuring current density.

Additional aspects of the beam measuring system provide for a plurality of Faraday detectors formed into an array. The array of Faraday detectors can be formed of Faraday cups sized and spaced relative to the size of the ion beam, such that a plurality of detectors are positioned within the cross-sectional area of the ion beam. The array of Faraday detectors can be oriented such that it extends parallel to the elongated axis of the ion beam, or the array can be oriented such that it extends along the width, or narrow direction, of the ion beam. The array of detectors identifies changes in current density along either the elongated axis or the shorter transverse axis of the ribbon beam, depending upon the orientation of the array. The array of detectors enables the measurement of small changes in current density throughout the ion beam that may cause hot spots or other non-uniformities. Once detected and measured, the hot spots and other non-uniformities can be compensated or removed.

The invention further contemplates that the beam measuring system include an intermittent detector positioned in the first portion of the ion beam that is used to directly treat the workpiece. These intermittent detectors are placed in the path of the ion beam, downstream of the workpiece and therefore are only exposed to the ion beam between the treatment of workpieces. The intermittent detectors can include either neutral beam detectors, mass analyzers, or Faraday detectors. Certain parameters of the ion beam may not rapidly vary under all conditions, and accordingly these parameters do not need to be constantly measured and updated. The intermittent detectors are positioned within the first portion of the ion beam to take advantage of these factors.

Additional features of the invention include a moveable support assembly mounting a detector. In one embodiment, the moveable support assembly scans a detector through the first portion of the ion beam treating the workpiece, while in another embodiment the moveable support assembly scans a detector through the second portion of the ion beam that extends beyond the workpiece. Alternatively, the moveable support assembly can be fashioned to enable scanning of the detector through both the first and second portions of the ion beam. For example, the moveable detector can scan across an ion beam to identify hot spots in the second portion of the ion beam contemporaneously with the treatment of the workpiece, or the moveable detector can be scanned across the ion beam to identify hot spots in the first portion of the ion beam between treatment of workpieces.

Other aspects of the invention include a parametric controller coupled with the beam measuring system for adjusting parameters of the ion beam in response to measurements of the ion beam. In particular, the parametric controller generates a set of control signals responsive to the measured parameters of the ion beam. The control signals are used to adjust various aspects of the ion implanting system. For instance, the parametric controller can generate a power control signal that is transmitted to the ion source and that modifies the excitation power supplied to the ion source. The parametric controller can also generate a flow control signal that is directed to the ion source. The flow control signal dictates the rate of flow of ionizable matter into the ion source. The parametric controller can also generate an electrode control signal that is coupled with the electrode assembly. This control signal instructs the electrode assembly on how to vary the voltages being applied across the various electrodes forming the electrode assembly.

The invention includes a method having the steps of producing an ion beam that extends along a beam path, and directing the ion beam towards the work piece in order to form a first portion of the ion beam for treating the workpiece and a second portion of the ion beam that extends beyond the edge of the workpiece. This method further includes the steps of measuring parameters in the portion of the ion beam that extends beyond the work piece contemporaneous with the treatment of the workpiece, and adjusting the treatment of the workpiece based on the measured parameters.

The ion beam parameters can be measured along a strip traversing the entire width of the ion beam, or the parameters can be measured along the length of the ion beam. In addition, the parameters can be measured by obtaining discrete measurements along a strip of the ion beam. Other aspects of the invention provide for distinct methods of measuring different ion beam parameters. For instance, a Faraday detector can be used to measure current density, a neutral beam detector can be used to measure the concentration of neutral atoms in the ion beam, and a mass analyzer can be used to measure the mass of particles in the ion stream.

Additionally, the invention includes varying the treatment of the workpiece based upon the measured parameters. For example, the speed of movement of the workpiece through the beam path is adjusted based upon the measured parameters. Other aspects include modifying the excitation power supplied to the ion source based upon the measured parameters. Additionally, the selection of ionizable matter and the flow rate of any selected matter is adjusted in response to the measured parameters. Further aspects provide for varying voltages applied to electrodes based on the measured parameters.

BRIEF DESCRIPTION OF THE DRAWINGS

The foregoing and other objects, features and advantages of the invention will be apparent from the following description and apparent from the accompanying drawings, in which like reference characters refer to the same parts throughout the different views. The drawings illustrate principles of the invention and, although not to scale, show relative dimensions.

FIG. 16 illustrates a pseudocode listing for implementing the controller of FIG. 3.

DESCRIPTION OF ILLUSTRATED EMBODIMENTS

Figure 1:
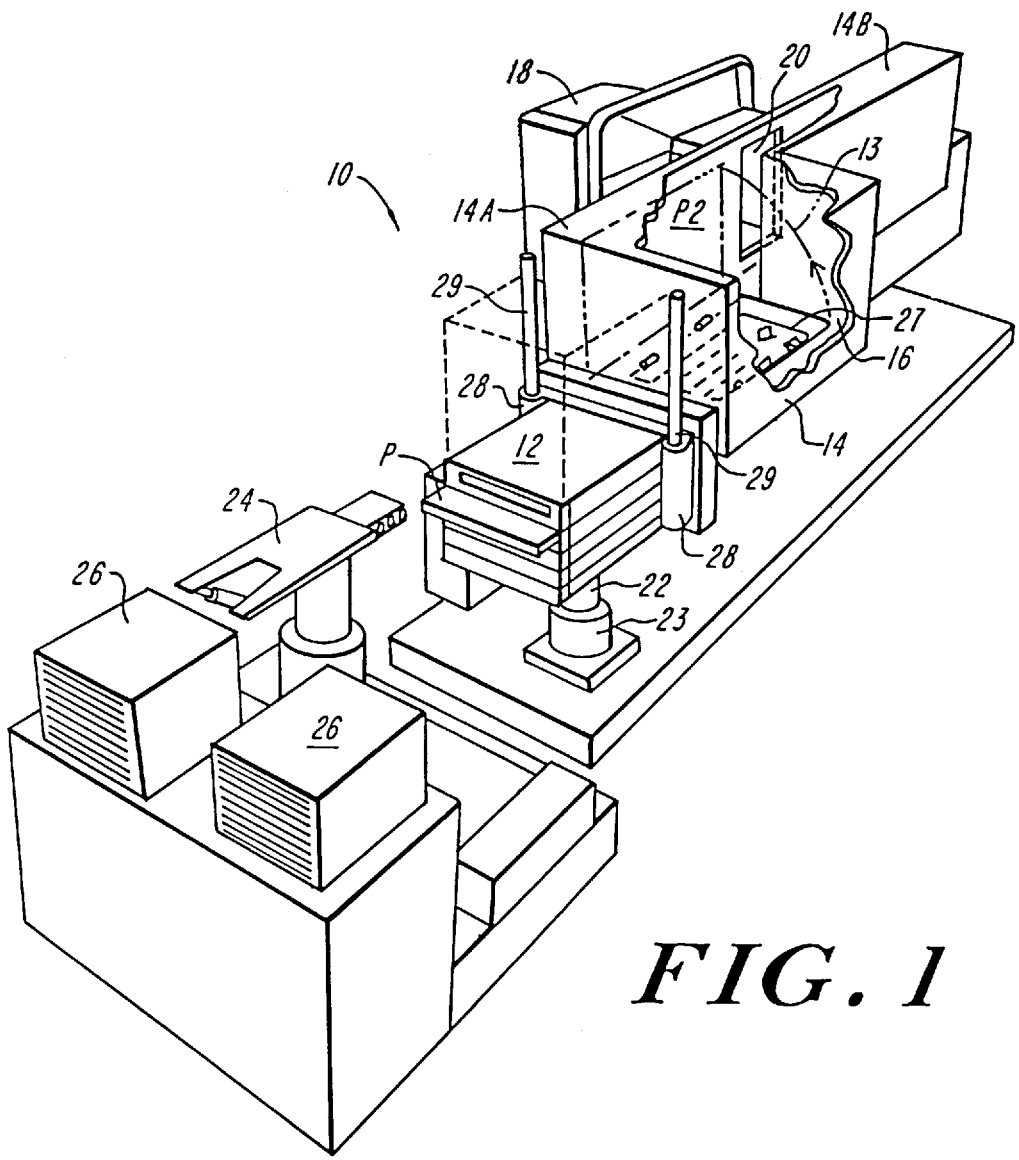
FIG. 1 is a perspective view of the ion implantation system according to the present invention.

The ion implantation system 10 of the present invention includes a pair of panel cassettes 26, an end effector 24, a loadlock assembly 12, a housing 14 which defines a process chamber 16, and an ion source 18, which communicates with the process chamber 16 through beam aperture 20. An end effector 24 transfers panels P stacked in cassette 26 to the loadlock assembly 12.

The illustrated end effector 24 is coupled to conventional drive and control mechanisms which provide power to the end effector and which control the rate and sequence of panel movement. The panel cassettes 26 are of conventional structure and provide a convenient storage facility for the panels.

The loadlock assembly 12 is also coupled to a linear bearing system and a linear drive system, which provide the desired vertical movement of the loadlock assembly 12 as well place and maintain hold the loadlock assembly 12 in sealing contact with the process chamber housing 14, as described in further detail below. The linear drive system includes a lead screw 22 and a motor assembly 23. The motor assembly 23 drives the lead screw 22 which in turn positions the loadlock assembly 12 at a selected vertical position, as indicated in dashed lines. The linear bearing system includes a pair of stationary linear bearings 28 mounted to the loadlock assembly which slide along circular shafts 29.

A translation assembly is preferably mounted within the process chamber 16. The translation assembly includes a pickup arm 27 which is similar in design and function to the end effector 24. The pickup arm 27 handles the panel P during processing. When the pickup arm 27 initially removes the panel P from the loadlock assembly 12, it is oriented in a substantially horizontal position P1. The pickup arm then vertically flips the panel, as denoted by arrow 13, into a substantially vertical position P2. The translation assembly then moves the panel in a scanning direction, from left to right in the illustrated embodiment, across the path of an ion beam emerging from aperture 20, and which is generated by the ion source 18.

Figure 2:
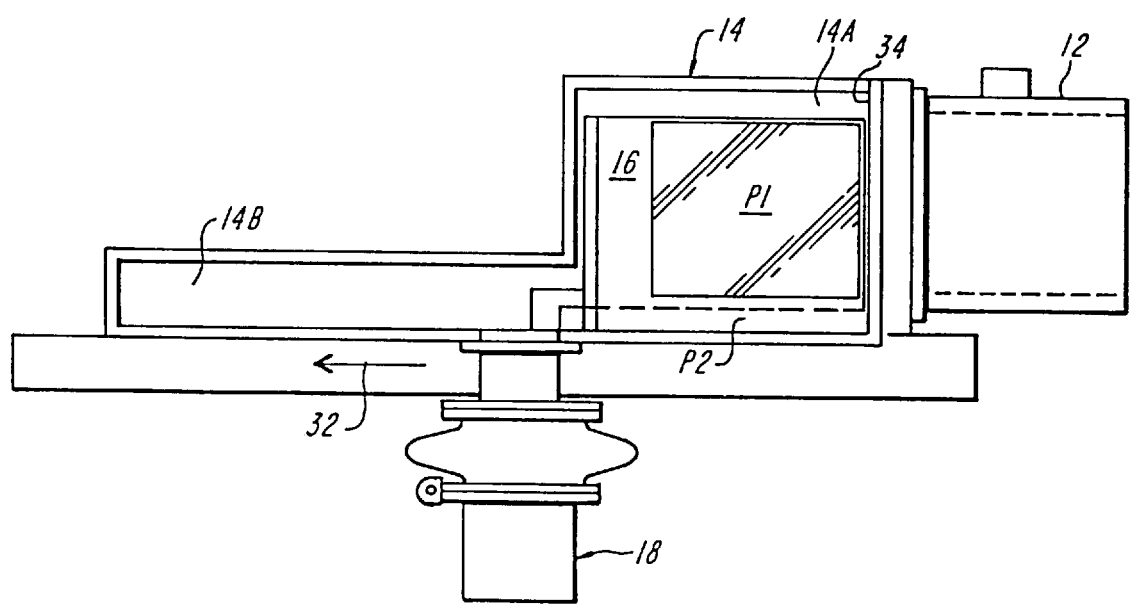
FIG 2 is a top view of a portion of the ion implantation system of FIG. 1.

With reference to FIGS. 1 and 2, the process chamber housing 14 includes a front housing portion 14A and a narrower elongated portion 14B. The front housing portion is sized to accommodate the removal of the panel P from the loadlock assembly 12 in the horizontal position. The panel is then moved from the original horizontal position P1 to the vertical position P2 prior to movement along the scanning direction, indicated in FIG. 2 by arrow 32. The housing portion 14B has an axial dimension along the scanning direction that allows the panel to pass completely by the ribbon beam generated by the ion source 18. The relatively narrow width of the chamber portion 14B preferably allows the panel to move there along only when disposed in the vertical position P2 to reduce the total volume of the process chamber 16. This reduction in chamber volume allows faster evacuation of the process chamber. Reducing the time necessary to evacuate the chamber serves to increase the total throughput of the implantation system 10.

The illustrated loadlock assembly 12 is preferably sealingly coupled to the front chamber wall 34 of the chamber housing 14. The loadlock assembly 12 maintains a relatively pressure-tight and fluid-tight seal with the chamber wall 34 during the vertical movement of the loadlock assembly 12. This sliding seal tight arrangement is described in further detail below.

Referring again to FIG. 1, the ion source 18 in conjunction with the aperture 20 forms a ribbon beam having a long dimension that exceeds at least the smaller dimension of the panel being processed. More specifically, the ion source generates a ribbon beam whose length exceeds the panel's narrow dimension. The use of a ribbon beam in conjunction with the ion implantation system 10 of the present invention provides for several advantages, including (1) the ability to process panel sizes of different dimensions with the same system; (2) achieving a uniform implant dosage by controlling the scan velocity of the panel in response to the sampled the current of the ion beam; (3) the size of the ion source can be reduced and is thus less expensive and easier to service; and (4) the ion source can continuously be operated. The continuous operation of the ion source increases the efficiency of the system 10 since it produces a more uniform implant by eliminating problems associated with turning the ion source off and on, as in prior approaches. These problems typically include beam current density transients which occur upon start-up operation of the source.

Figure 3:
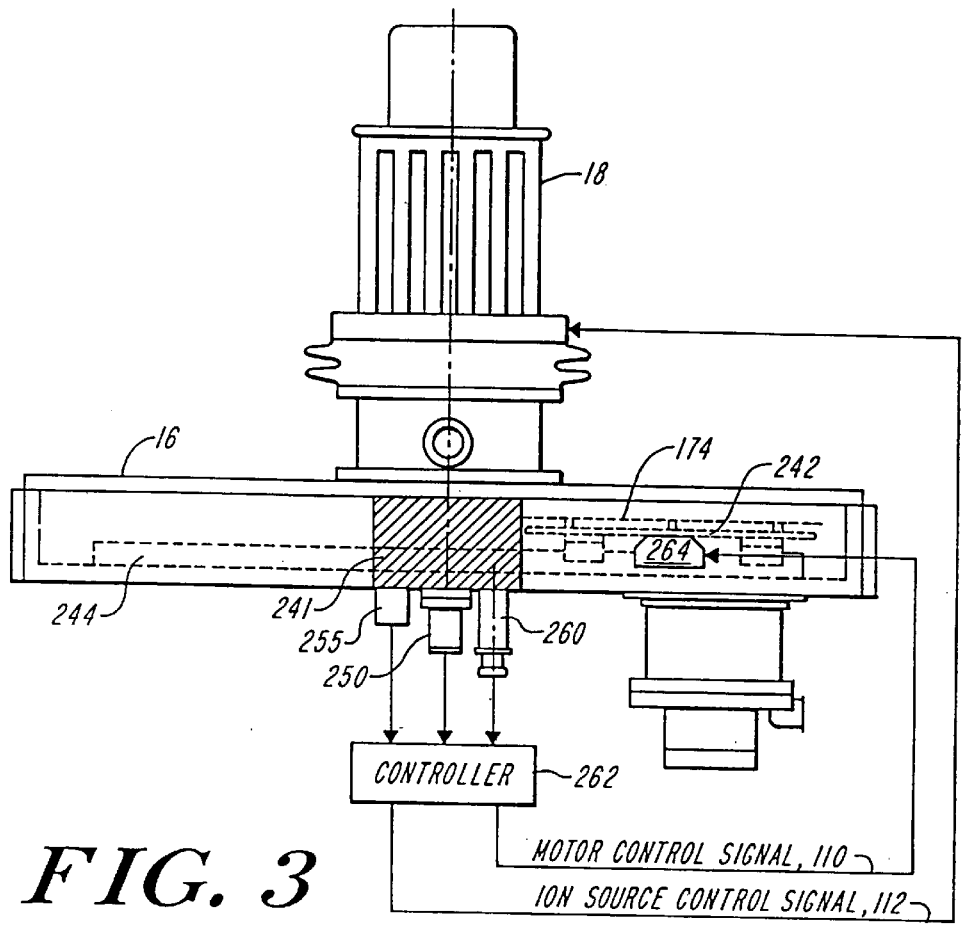
FIG. 3 is a cross sectional view of the ion beam assembly and process chamber of FIG. 1.

FIG. 3 illustrates a system for controlling ion implantation. In particular, FIG. 3 shows a cross sectional view having an ion source 18 mounted above a process chamber 16. The process chamber 16 contains a work piece platform for supporting the work piece 174 below the ion beam 241. The work piece platform can be further characterized as a translating mechanism for moving the workpiece through the ion beam 241. The illustrated translating mechanism includes a table 242 mounted to rails 244 and a motor 264 for controlling movement of the table 242 along rails 244.

FIG. 3 further illustrates a beam measuring structure mounted to the underside of the process chamber 16. The beam measuring structure can include a Faraday detector 250, a mass analyzer 255, and a neutral beam analyzer 260. The beam measuring structure is coupled with and communicating to a controller 262. The controller 262 generates a motor control signal 110 and an ion source control signal 112. The controller directs the action of motor 264 with motor control signal 110 and the controller directs the ion source 18 with control signals 112. The motor control signal 110 and the ion source control signal 112 can be generated by the controller 262 based on predetermined state diagrams or functions. Alternatively, the controller can generate control signals 110 and 112 in response to measurements made by the Faraday detector 250, the mass analyzer 255, and the neutral beam detector 260.

The control system shown in FIG. 3 is a closed loop system. The control system can be characterized as beginning with the ion source 18 generating an ion beam 241. The parameters of the ion beam 241 are detected by the Faraday detector 250, the mass analyzer 255, and the neutral beam detector 260. The controller 262 receives the data generated by the detectors 250, 255, 260 and generates the motor control signal 110 and the ion source control signal 112 in response to the measured parameters of the ion beam. The ion source control signal 112 is directed to the ion source 18 and is used to modify and update the parameters of the ion beam 241, thereby closing the loop in this control system.

The Faraday detector 250 is a form of detector that traps and measures ion beam current while blocking the escaped electrons from within the cage and excluding electrons which might accompany the beam. Faraday detectors are universally used to measure implantation dose. The Faraday detector provides a device for measuring one parameter, ion implantation dosage, of the ion beam 241. The level of measured ion implantation dosage acts as an input to the controller 262.

The controller 262, based in part upon the measured ion implant dosage, determines whether the appropriate dosage of ions is being implanted into the workpiece 174. If the total dosage calculated by the controller 262 in response to the measured parameter does not meet the desired levels of dosage, then the controller can modify the speed of the workpiece passing through the ion beam to adjust the dosage levels. For instance, the controller 262 can increase the speed at which the workpiece is moved through the ion beam to reduce the total dopant applied to the workpiece. Similarly, the controller 262 can decrease the speed at which the workpiece is moved through the ion beam to increase the total dopant applied to the workpiece.

Furthermore, if the dosage calculated by the controller 262 in response to the measured parameter does not meet the desired levels of dosage, then the controller can modify the dosage level per unit time being supplied by the ion source 18. Increasing the rate of dosage applied by the ion beam at a particular velocity of the workpiece will increase the doping applied to the workpiece. Analogously, reducing the rate of dopant applied by the ion beam while keeping the velocity of the workpiece constant will decrease the total dopant applied to the workpiece. Thus, if the controller knows the desired dopant level for the workpiece, the rate of implant generated by the ion beam 241, and the speed of the workpiece being moved through the implant, the controller 262 can ensure that the workpiece is treated with the desired level of dopant.

Besides the level of dopant applied to the workpiece 174, another critical factor in implanting workpieces is the temperature of the workpiece 174 during the implantation process. Typically, the temperature of the workpiece cannot exceed a predetermined critical temperature level. If the level of the workpiece exceeds the critical temperature, then the workpiece may undergo thermal stresses that cause unacceptable defects. The temperature of the workpiece rises as a result of particles striking the work piece. Accordingly, it is possible to calculate the temperature rise of the workpiece given the number of particles striking the workpiece and the energy of the relevant particles. In one aspect of the invention, the controller 262 is used to prevent the workpiece from exceeding the critical temperature level. Under this aspect of the invention, the controller 262 determines the theoretical temperature rise in the workpiece surface based on measured parameters of the ion beam and controls the ion implantation system 10 to prevent the workpiece temperature from exceeding the critical temperature of the workpiece.

Further, in accordance with this aspect of the invention, the controller 262 utilizes the measurements of Faraday detector 250, mass analyzer 255, and neutral beam detector 260. A faraday detector 250 is used to identify the rate of ionized particles striking the workpiece, but it is known in the art that a Faraday detector does not detect neutral ions. Detecting the neutralized atoms is relevant to determining the temperature rise of the workpiece because the neutralized atoms have roughly the same energy as ions, and are individually equivalent to them in so far as implantation dose is concerned. In the event that the beam striking the Faraday detector contains neutral atoms and these neutral atoms are not being detected by the Faraday detector, errors in determining the temperature of the workpiece may occur. Accordingly, the controller 262 accounts for both the ionized particles measured by the faraday detector and the neutralized particles measured by the neutral beam detector when calculating the temperature rise in the workpiece.

The ion implantation system illustrated in FIG. 3 also includes a mass analyzer 255 measuring parameters of the ion beam 241. The mass analyzer identifies the species of elements contained in the ion beam 241. Identifying the species within the ion beam is relevant to obtaining an accurate projection of the dose applied to the workpiece. Accordingly, controller 262 also accounts for the species of particles in the ion stream when determining the temperature of the workpiece.

Controller 262 generates motor control signal 110 and the ion source control signal 112 in response to the measured parameters of the detectors 250, 255, and 260. The motor control signal 110 is coupled with the motor 264 and directs the speed of translation of the workpiece 174 through the ion beam 241. The ion source control signal 112 is coupled with the ion source 18 and varies the parameters of the ion beam 241. By either varying the speed of translation of the workpiece or by varying the parameters of the ion source, the controller 262 can control the dopant level of the workpiece 174 and the controller 262 can keep the workpiece temperature within a predetermined temperature range. Accordingly, the ion implantation system disclosed herein achieves a dopant level in the workpiece that varies by less than 0.5% from the desired dopant level.

Figure 4:
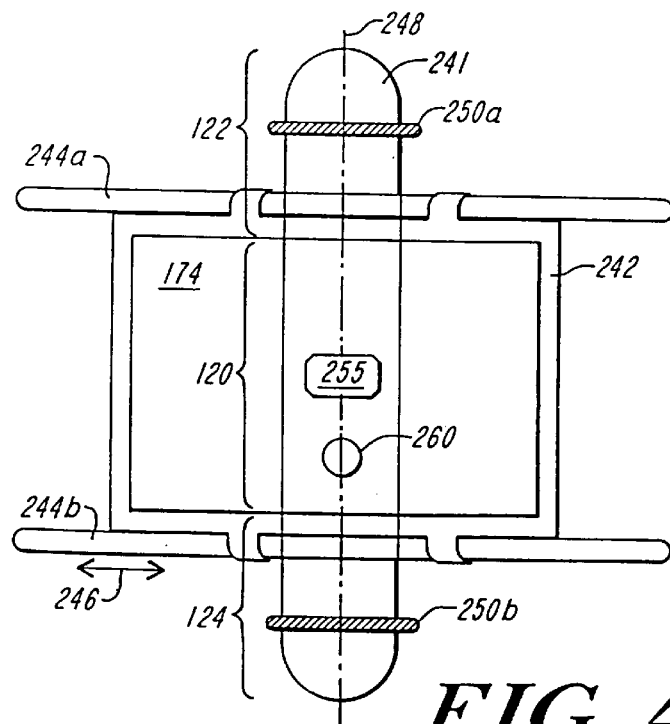
FIG. 4 is overhead cross sectional view of a mechanism for translating the workpiece through the ion implantation system of FIG. 1, the translating mechanism having a platform mounted to a pair of rails.

FIG. 4 illustrates an overhead view of a workpiece platform for moving a workpiece under the ion beam 241. The workpiece platform, as shown, includes two substantially parallel rails 244A and 244B and a table 242 mounted to the rails 244A and 244B. The table 242 can be mounted to the rails using slidable mounts known in the art, such as a linear bearing or an air bearing. The table 242 is mounted in a fashion that allows the table to move along axis 246, and the motor 264 (not shown) drives the table 242 along the direction of axis 246.

In operation, the controller 262 determines the number of passes of the workpiece through the ion beam, and the dopant level during each pass, that is required to obtain the desired level of total dopant in the workpiece. The controller 262 then directs the motor to move the workpiece platform and its associated workpiece through the ion beam the required number of passes, at the required speed. The structure shown in FIG. 4 provides the capability to pass the workpiece 174 back and forth through the ribbon beam 241.

Figure 4A:
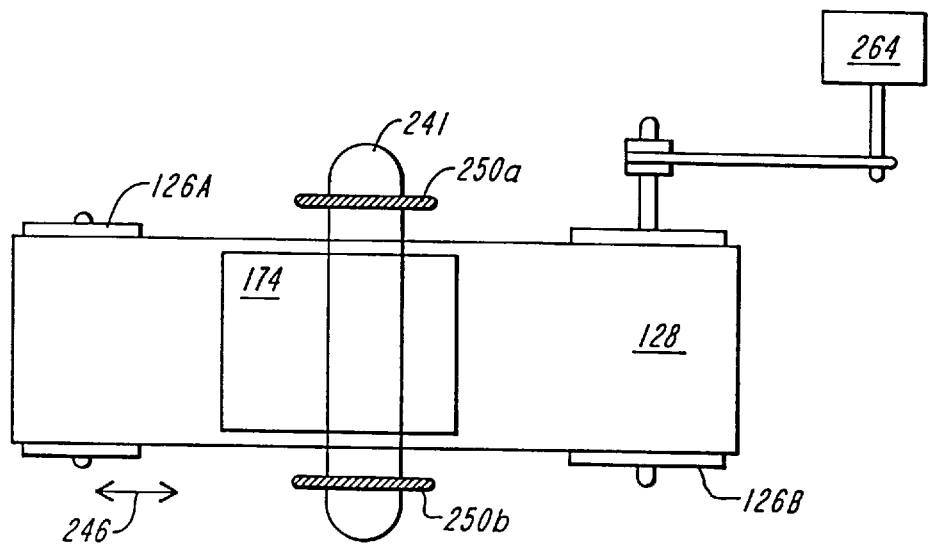
FIG. 4A is an overhead cross sectional view of a mechanism for translating the workpiece through the ion implantation system of FIG. 1, the translating mechanism having an endless belt mounted to a pair of rollers.

FIG. 4A shows an alternative structure for translating the workpiece through the ion beam 241. The workpiece platform includes two substantially parallel rollers 126A and 126B and an endless belt 128 surrounding the rollers 126A, 126B. The belt is moveable along axis 246, such that the workpiece 174 passes through the ion beam. The motor 264 is mechanically coupled with roller 126B, and motor 264 applies a force capable of moving the belt 128 along axis 246.

Figure 4B:
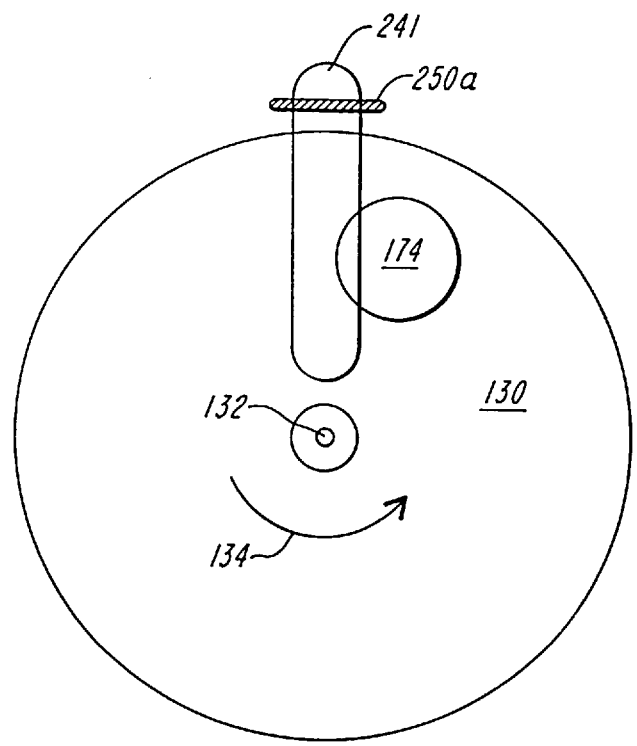
FIG. 4B is an overhead cross sectional view of a mechanism for translating the workpiece through the ion implantation system of FIG. 1, the translating mechanism having are platform mounted to an axle.

FIG. 4B shows a further alternative structure for translating the workpiece through the ion beam 241. The workpiece platform, as shown, includes a circular table 130 mounted to an axle 132 that projects out of the plane of the circular table 130. The circular table is rotatable around the axle in a direction 134. The motor 264 (not shown) is drives the circular table 130 around the axle 132, such that the workpiece 174 passes through the ribbon beam 241.

With further reference to FIGS. 4, 4A, and 4B, the illustrated ion beam 241 has a first portion 120 of the ion beam that overlies the workpiece 174, and has a second portion 122 of the ion beam that extends beyond the edge of the workpiece. The ion beam 241 can include additional portions 124 that also extend beyond the edges of the workpiece 174. Typically, the ion beam extends 5-20 centimeters beyond both edges of the workpiece. The first portion 120 of the ion beam that overlies the workpiece treats the workpiece, while those portions of the ion beam extending beyond the workpiece do not actively treat the workpiece. Rather those portions of the ion beam, such as portions 122 and 124, that extend beyond the workpiece are used for measuring parameters of the ion beam contemporaneous with the treatment of the workpiece.

Preferably, the ion source 18 generates a ribbon beam having a cross sectional area as shown in FIGS. 4, 4A, and 4B. The ribbon beam is an ion beam elongated along one axis. The axis of elongation of the ribbon beam is labeled as axis 248 in FIG. 4 and is shown to be substantially perpendicular to the direction of movement of the workpiece 174 along axis 246. The ribbon beam structure for the ion stream advantageously allows portions of the ion beam to extend beyond the workpiece in a manner that is sufficient to measure the parameters of the ion beam, without detrimentally detracting from the efficiency of the ion beam in treating the workpiece 174. Preferably, the ribbon beam extends 5-20 centimeters beyond both edges of the workpiece.

FIG. 4 further illustrates the location of the group of detectors used in measuring the parameters of the ion beam. The detectors shown are two Faraday detectors 250A and 250B, the mass analyzer 255, and the neutral beam detector 260. The position of the Faraday detectors 250A and 250B within portions 122 and 124 allow the current density of the ion beam to be measured contemporaneously with the treatment of the workpiece. In comparison, the positioning of the mass analyzer 255 and the neutral beam detector 260 within the first portion of the ion beam prevents detectors 255 and 260 from measuring parameters of the ion beam contemporaneous with the treatment of the workpiece. The mass analyzer 255 and the neutral beam detector 260 only detect parameters of the ion beam when no workpiece is placed under the ion beam 241. Thus, the mass analyzer and the neutral beam detectors, as positioned, only operate on an intermittent basis.

The illustrated Faraday detectors 250A and 250B have a length that exceeds the width of the ribbon beam. In addition, each Faraday detector is positioned such that it spans the width of the ribbon beam. As shown, each Faraday detector measures the total current being implanted by the ribbon beam along a strip of the ribbon beam. The Faraday detector acts as an integrator summing the current being applied by the ribbon beam over the strip spanning the width of the ribbon beam. Thus, the Faraday detector measures the linear current density of the beam at the position of the detector. The size and positioning of the Faraday detector relative to the size and shape of the ion beam 241, provides for the accurate measurement of dopant being applied to the workpiece as the workpiece passes the ion beam.

Figure 5:
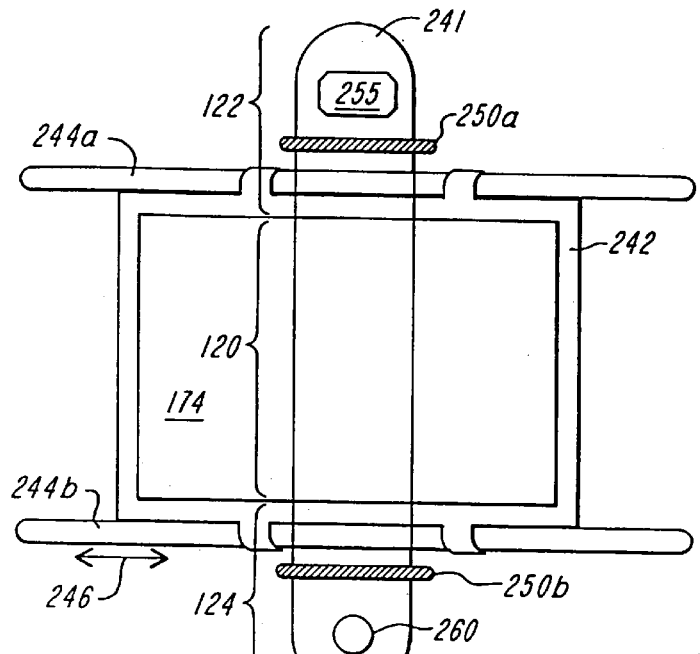
FIG. 5 is an alternative overhead cross sectional view of the translating mechanism of FIG. 1 showing an alternate placement for the neutral beam detector and the mass analyzer.

FIG. 5 illustrates another embodiment of the invention where all detectors are positioned outside of the first portion 120 of the ribbon beam. Under this embodiment, all detectors measure parameters of the ion beam contemporaneously with the treatment of the workpiece. This embodiment proves advantageous when real-time data is required concerning all parameters of the ion beam or when tight constraints on the ion beam implantation process exist.

Figure 6:
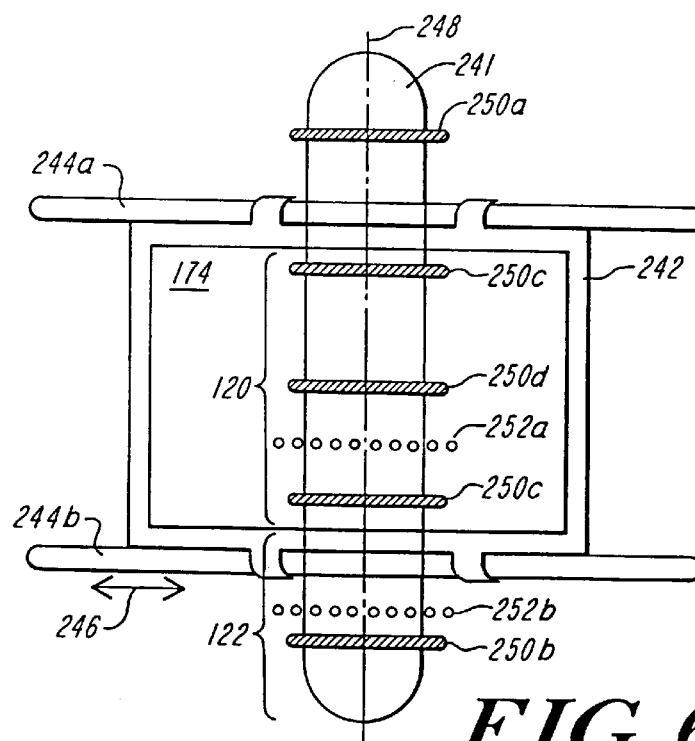
FIG. 6 is an overhead cross sectional view of the translating mechanism of FIG. 1 showing an array of Faraday detectors.

FIG. 6 illustrates another aspect of the invention having an array of Faraday detectors. A first array of detectors extends along the elongation axis 248 and includes detectors 250A, 250B, 250C, 250D, and 250E. A second array of detectors 250A and a third array of detectors 250B extend along an axis substantially transverse to the elongation axis 248.

The first array of detectors typically includes an array of slots, each slot spanning the width of the ribbon beam 241. The array of slots extends along the length of the elongation axis 248 and extends into those portions of the ion beam that treat the workpiece and into those portions of the ion beam that extend beyond the edge of the workpiece. As arranged, the slots provide a measurement of the variability of the current density along the length of the ribbon beam. In particular, each of the Faraday slots 250A–250D provides a discrete data point representative of the total dopant being applied to the workpiece at a particular point along the length of the ribbon beam.

In comparison, the second array of Faraday detectors 252A and the third array of Faraday detectors 252B provide a measurement of variability of the current density along the width of the ribbon beam. For example, the second array of Faraday detectors 252A includes a number of Faraday cups aligned along an axis substantially transverse to axis 248. Each of the Faraday cups forming the array 252A provide a measurement of the current density at points extending along the width of the ribbon beam. The relationship between the measurements in the array of detectors provides an indication of the variability in current density along the width of the ribbon beam 241. The third array of Faraday detectors 252B also includes a number of Faraday cups. The array of detectors in 252A differs from the array of detectors in 252B by positioning. That is, the array 252A is located in the first portion 120 of the ion beam, and the array 252B is located within the second portion 122 of the ion beam.

Figure 7:
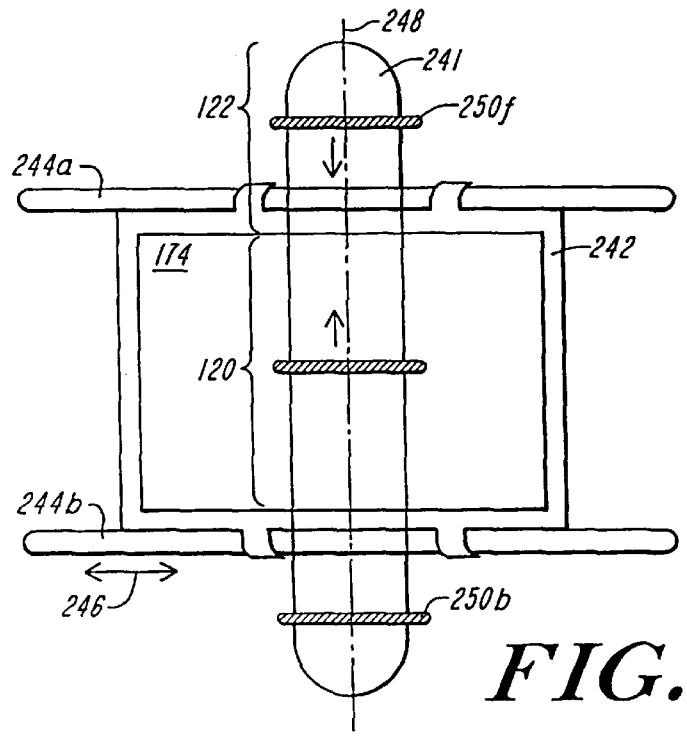
FIG. 7 is an overhead cross sectional view of the translating mechanism of FIG. 1 showing a permanently positioned Faraday detector and a moveable Faraday detector.

FIG. 7 illustrates an additional embodiment for measuring the fluctuations in current density along the length of ribbon beam 241. FIG. 7 illustrates a Faraday slot 250F that is moveable along the elongation axis 248 of the ribbon beam. The Faraday detector 258 is mounted to a moveable support structure (not shown) that moves the Faraday detector along axis 248. In one aspect of the invention, the Faraday detector 250F is moveable along the length of the first portion 120 of the ribbon beam. In a different aspect of the invention, the Faraday detector 250F is moveable along a second portion 122 of the ion beam 241. In other instances, the Faraday detector 250F is moveable along and between both the first and second portions of the ion beam.

Figure 8:
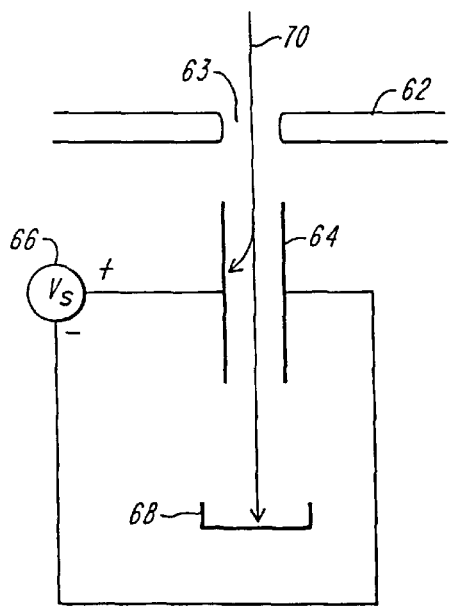
FIG. 8 is a cross-sectional view of the neutral beam detector of FIG. 3.

FIG. 8 illustrates a schematic diagram of a neutral beam detector used to measure neutralized particles in the ion stream 241. The neutral beam detector includes an entrance aperture 62 having an opening 63 through which the particles 70 pass. The detector also has a pair of deflecting plates 64 that are energized by a voltage supply 66. In addition, the neutral beam detector includes a bolometer 68 for measuring the number of particles passing through the deflecting plates 64.

In operation, a stream of particles 70 passes through the opening 63 in the aperture 62. These particles are directed between the deflecting plates 64. The deflecting plates are energized so that the line of flight of ionized particles veers to the left or to the right, and neutral particles proceed along a straight path. Ionized particles are focused to the left or right of the bolometer and are not measured. In comparison, neutral particles proceed straight towards the bolometer and are measured. Accordingly, the bolometer 68 provides a measurement of the neutral particles in the ion beam 241.

Figure 9:
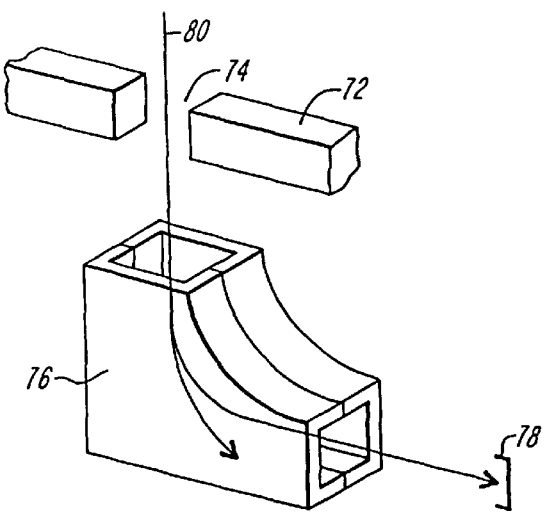
FIG. 9 is a cross-sectional view in perspective of the mass analyzer of FIG. 3.

FIG. 9 is a schematic illustration of the mass analyzer 255 shown in FIG. 3. The mass analyzer includes an entrance aperture 72 having an opening 74 through which the particle stream 80 passes. The mass analyzer also includes a pair of analyzing magnets 76 defining a magnetic deflection gap, and a particle detector 78. A magnetic field is produced in the deflection gap by a pair of coils. The coils are energized by a power source to produce a static, substantially uniform magnetic field in the deflection gap.

In operation, a stream of particles 80 enters the magnetic structure through the opening 74 and is deflected by the magnetic field produced in the magnetic deflection gap through an angular trajectory. The deflection of particles 80 is dependent on both the mass of the particles and the magnetic field. Thus, only a selected group of particles will be turned by the magnetic field to the degree necessary to exit the analyzing magnets. Those selected particles exiting the magnetic structure 76 are detected by the particle detector 78. While the species of particles not selected are focused to the left or right of the detector 78. Accordingly, the mass analyzer provides for a structure that determines the concentration of particles in the ion stream having a selected mass.

Figure 10:
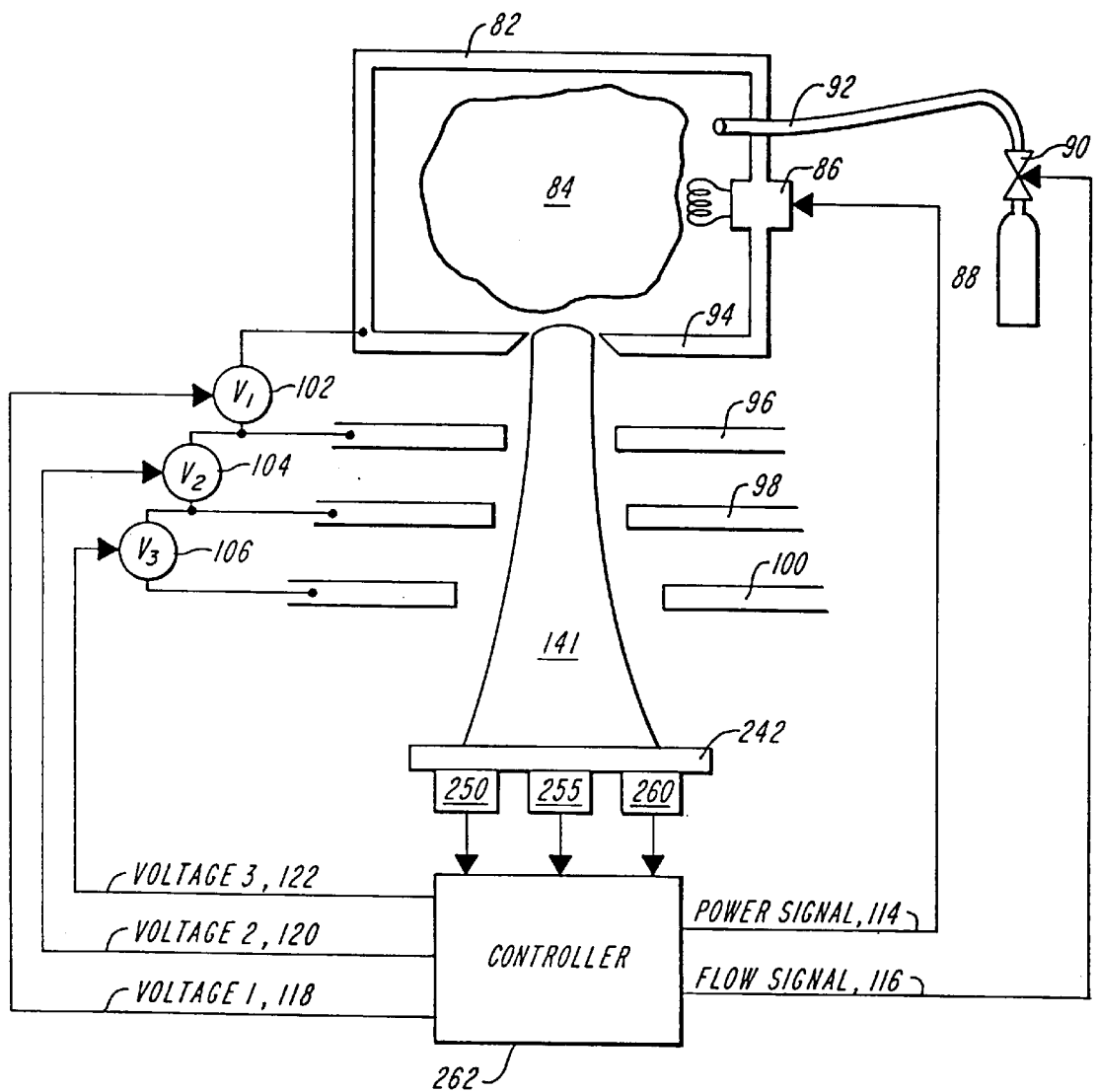
FIG. 10 is a diagrammatic view of the controller and the ion source control signal of FIG. 3.

FIG. 10 schematically illustrates the interaction between the controller 262 and the ion source control signal 112 of FIG. 3. The ion source control signal 112 includes a power signal 114, a flow signal 116, a voltage signal 118, a voltage2 signal 120, and voltage3 signal 122. The controller 262 generates output signals 114, 116, 118, 120, and 122 in response to input signals received from the faraday detector 250, the neutral beam detector 260, and the mass analyzer 255.

FIG. 10 further illustrates elements of the ion beam implantation system 10 that are responsive to the control signals generated by the controller 262. In particular, FIG. 10 shows the ion chamber 82 for containing the plasma 84, and an ignitor 86 for exciting the plasma 84. A container 88 for holding ionizable matter is connected to the ion chamber 82 via a conduit 92. The flow of ionizable matter from the container 88 to the ion chamber 82 is governed by a valve 90. In addition, a set of electrodes including a plasma electrode 94, an extraction electrode 96, a suppression electrode 98, and a ground electrode 100, are shown in FIG. 10.

The ignitor 86 is representative of electrons sources or plasma initiators known in the art. For instance, ignitor 86 can be a microwave power source projecting an energy transmission through a quartz plate or a tungsten filament emitting electrons into the ion chamber. The power output by the ignitor 86 is selectable. In particular, the controller 262 is coupled with the ignitor 86 by the power signal 114. The controller 262 directs the power output by the ignitor via the power signal 114, thereby modifying the current density of the ion stream exiting the plasma chamber 82.

The valve 90 governs the introduction of ionizable matter into the ion chamber 82 and the valve 90 is selectable. The controller 262 is coupled with and directs the valve 90 by flow signal 116. Thus the controller directs the rate of flow of ionizable matter into the ion chamber by controlling valve 90. By directing the quantity and type of ionizable matter introduced into the ion chamber, the controller obtains further control over the plasma conditions in the ion source.

In accordance with a further aspect of the invention, the controller 262 exercises control over the electrodes 94, 96, 98, and 100 via voltage control signals 118, 120, and 122. In particular, the plasma stream exits the ion chamber 82 through a plasma electrode 94. The ion stream is then directed and accelerated by an ion beam assembly that includes the extraction electrode 96, the suppression electrode 98, and the ground electrode 100. Three variable voltage supplies regulate the voltages between the electrodes 94, 96, 98, and 100. For instance, voltage supply 102 biases the voltage between the plasma electrode 94 and the extraction electrode 96, voltage supply 104 biases the voltage between the extraction electrode 96 and the suppression electrode 98, and voltage supply 106 biases the voltage between the suppression electrode 98 and the ground electrode 100. Controller 262 directs voltage supplies 102, 104, and 106 via voltage regulation signals 118, 120, and 122, thereby exercising control over the electrodes 94, 96, 98, and 100.

By controlling the voltages applied to the electrodes 94, 96, 98, and 100, the controller can adjust the width of the ion beam exiting the plasma chamber 82. The voltage supplies 102, 104, and 106 are typically adjusted so that the plasma electrode, the extraction electrode, and the suppression electrode are at a selected voltage relative to the ground electrode. The ground electrode is typically adjusted to zero volts, the suppression electrode 98 is adjusted to be minus three kilovolts, the extraction electrode is adjusted to be at 90 kilovolts, and the plasma electrode is typically adjusted to be at 95 kilovolts. The controller can adjust the voltages of the voltage supplies away from their normal values to make adjustments to the ion stream exiting the plasma chamber 82. In particular, the controller 262 can adjust the voltages to modify the width of the ribbon beam. By modifying the width of the ribbon beam the density of the ion stream can be spread out across the workpiece or it can be further concentrated on the workpiece. Adjustments to the width of the ion stream can also prove useful in controlling the rate of temperature rise at the work piece surface. In this way the maximum temperature of the surface of the workpiece can be adjusted.

FIGS. 11–15 illustrate an implementation of the controller 262. In particular, FIGS. 11–15 illustrate a set of software flow diagrams detailing a set of software instructions that can be implemented on a general purpose computer. The illustrated flow diagrams cause the general purpose computer to execute a set of instructions implementing the controller 262.

In general, dosimetry control over the workpiece is governed by two equations: one for computing the sub-dose and one for the temperature rise of the workpiece. The equations contain a number of parameters related to the properties of the beam, the temperature model, the scan speed, the number of sub-implants, etc. In one aspect of the invention, it has been determined that it is necessary only to consider the number of sub-implants, the number of scans per sub-implant, the scan speed, and the current density as variables (primary control parameters) to determine the combination of parameters that will yield an optimal throughput. Other parameters can be assumed to be constant for an implant.

The sub-dose $D_i$ is given by:

$$D_i = \frac{D}{N_p} = \frac{N_s}{\gamma J V_s} \quad \text{(EQ. 1)}$$

where D is the total dose, $N_p$ the number of passes or sub-implants, $N_s$ the number of scans per sub-implant (will probably be fixed at 2), and $V_s$ the scan speed. Solving for, $N_p$ $$N_p = \frac{1 V_s D}{\gamma N_s J} \quad \text{(EQ. 2)}$$

The workpiece temperature rise (above initial conditions) is given by:

$$\Delta T = D_i \left[ \alpha + \beta \frac{V_s}{N_s} \right] \quad \text{(EQ. 3)}$$

where the term in alpha corresponds to the core temperature rise and the term in beta corresponds to the surface temperature rise.

Equations 1 and 2 give:

$$\Delta T = J \left[ k_1 * \left( \frac{N_s}{V_s} \right) + k_2 \right] \quad \text{(EQ. 4)}$$

$$\Delta T = D_i [k_3 + k_4 J] \quad \text{(EQ. 5)}$$

From EQ. 2 it is seen that to minimize the number of sub-implants for a given dose, the scan speed should be minimized and the current density maximized. From EQ. 4 it is clear that workpiece temperature decreases with increased scan speed and decreased current density. Thus the objective of the controller 262 will be to operate with maximum current density and minimum scan speed consistent with the limits on the temperature rise, and with any other limits imposed on the current density scan speed, or the number of sub-implants.

Due to the dosimetry constraints, the dosimetry equations cannot be solved in closed form. Even if an interior solution can be found (does not lie on any constraint boundary), the requirement that all sub-implants be equal dictates that an iterative algorithm is required. Iterative procedures require starting values to be defined. From EQ. 1, it is clear that the primary control variables (number of sub-implants, beam current density, and scan speed) are not all independent, and from EQS. 3 and 5 it is evident that the number of sub-implants (sub-dose) required to satisfy the temperature rise constraint can be determined from either a starting value of the beam current density or the scan speed. With this background, FIGS. 11–15 illustrate flow charts for controller 262 under circumstances where different primary control parameters are fixed. The flowcharts demonstrate how the controller 262 establishes the initial primary control parameters for the ion implantation system 10. These parameters can be updated and modified during the operation of the system 10, depending upon the data measurements obtained from the faraday detector, the neutral beam detector, and the mass analyzer.

Figure 11:
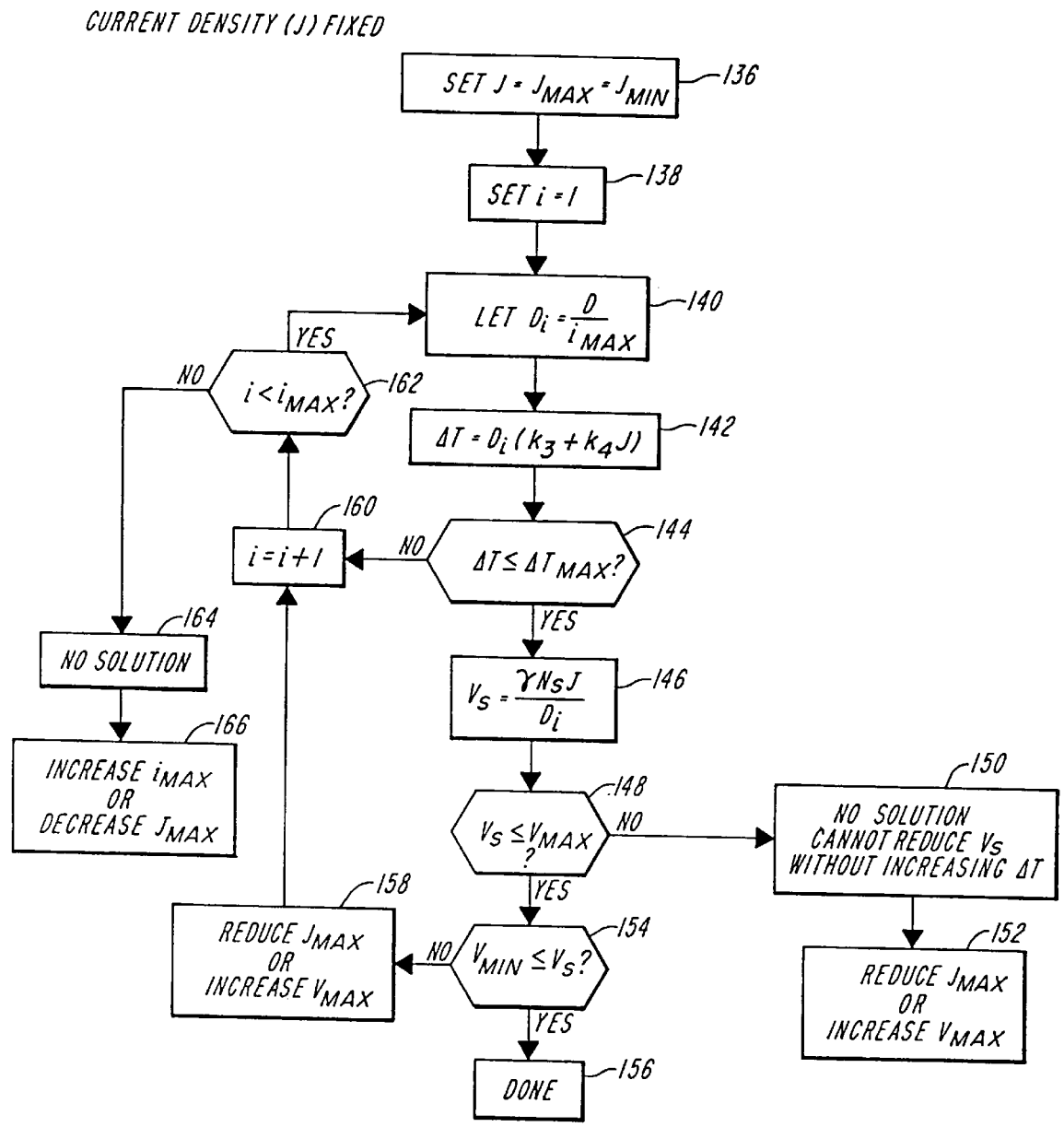
FIGS. 11–15 are flow charts illustrating the software implementation of the controller of FIG. 3.

FIG. 11 illustrates a flow chart for controller 262 under the case where the current density is fixed by the user.

The controller 262 begins processing at action block 136 where the current density is fixed. The initialization routine continues at block 138 where a sub-implant counter is set to 1. At block 140, the implantation sub-dose is set equal to the maximum dosage divided by the maximum number of passes through the ion beam. At block 142 the workpiece temperature rise is set equal to the sub-dosage multiplied by a group of constants, all in accordance with EQ. 5 as discussed above. After block 142, control proceeds to decision block 144. At decision block 144 control of the flow diagram passes to action block 146 if the temperature rise is less than the maximum temperature rise allowed. Otherwise, if the temperature rise is not less than the maximum allowable temperature rise, control proceeds to block 160.

At block 146 the scan speed is set in accordance with EQ. 2 as discussed above. After 146, logical flow proceeds to decision block 148. At decision block 148 if the scanned velocity is determined to be less than the maximum allowable scanned velocity, control proceeds to decision block 154. If scanned velocity is found to be greater than the maximum allowable scanned velocity, then control proceeds to action block 150.

At action block 150, the controller 262 has determined that a solution does not exist given the current parameters. As a result, control proceeds to action block 152 where the controller 262 either reduces the maximum allowable current, or increases the maximum allowable scan velocity.

At decision block 154, the controller 262 determines whether the scanned velocity exceeds the minimum allowable scanned velocity. If the scanned velocity exceeds the minimum allowable velocity, then control proceeds to action block 156.

At action block 156, the controller 262 has reached a realizable solution for the control parameters. Accordingly, the controller 262 begins the implantation process given the current control parameters.

At action block 158, the controller 262 has determined that given the current parameters a solution is not realizable. As a result, controller 262 will either reduce the maximum allowable current density, or increase the maximum allowable scanned velocity in order to obtain a realizable solution. After action block 158, control proceeds to action block 160.

At action block 160, the controller 262 increments the sub-implant counter by one. After 160, control proceeds to decision block 162. At decision block 162 if the current sub-implant count is less than the maximal allowable sub-implant count, then control proceeds to action block 140. Otherwise, if the current sub-implant count exceeds the maximum allowable sub-implant count, control proceeds to action block 164.

At action block 164, the controller has determined that no solution given the parameters is realizable. Accordingly, control proceeds to action block 166 where the controller either increases the maximum allowable sub-implant count or decreases the current density in order to reach a realizable solution.

Figure 12:
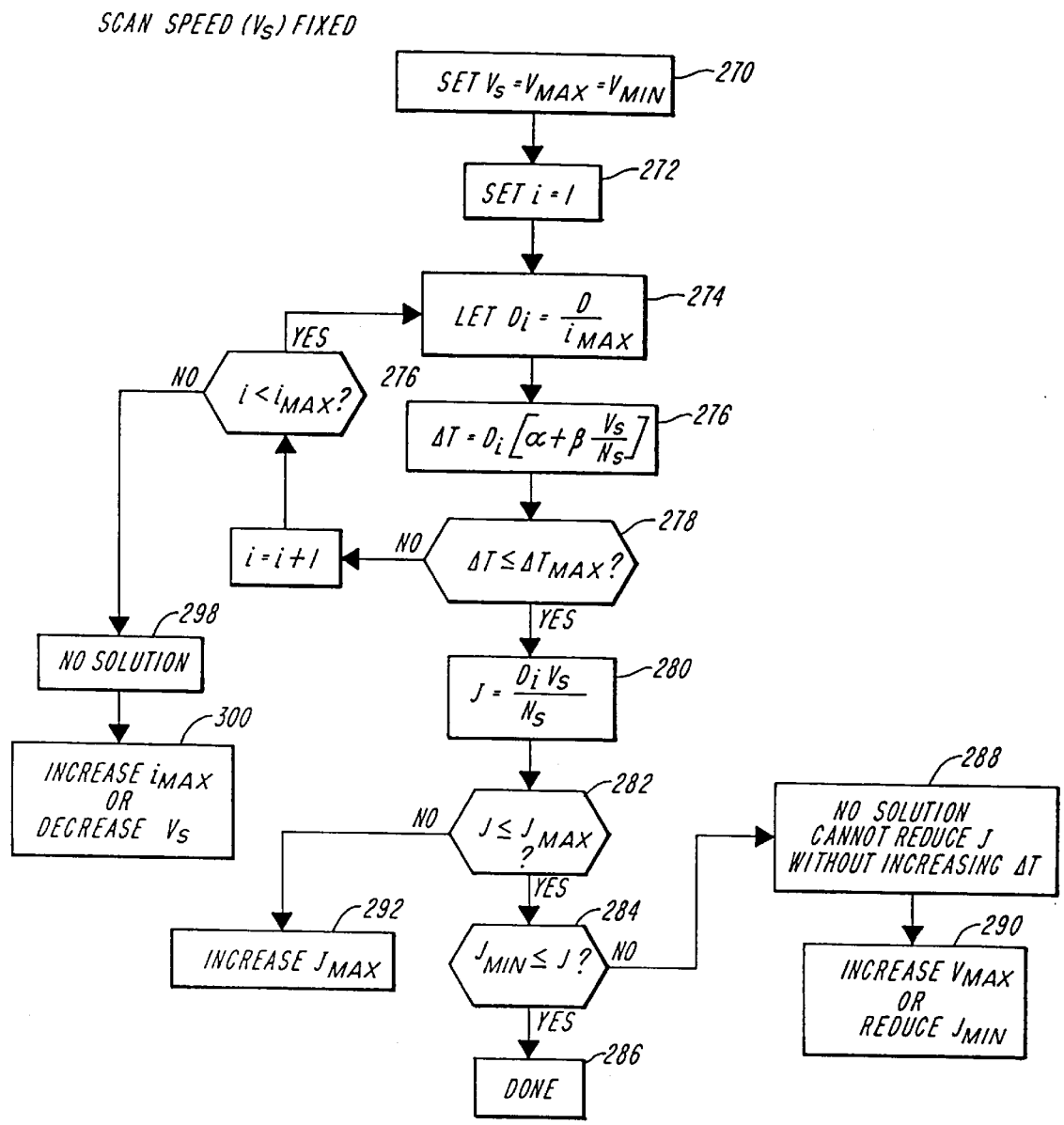

FIG. 12 illustrates a flow chart for controller 262 under the case where the scan speed is fixed by the user.

The controller begins at action block 270 where the scan velocity is set. Initialization of the system continues at action block 272 where the sub-implant count is set to one and proceeds to action block 274 where the sub-dosage is set to the maximum dose divided by the maximum number of scans. After block 274, control proceeds to block 276 where the workpiece temperature rise is set according to EQ. 3. After action block 276, control proceeds to decision block 278. At decision block 278 the controller determines whether the workpiece temperature rise is less than the maximum allowable temperature rise. If the temperature rise is less than the maximum temperature rise allowable, then control proceeds to action block 280. Otherwise, control proceeds to action block 294.

At action block 280 the current density is determined in accordance with EQ. 1. After action block 280 control proceeds to decision block 282. At decision block 282, the controller determines whether the calculated current density is less than the maximum allowable current density. If the calculated current density exceeds the maximum allowable current density, then control proceeds to action block 292. At action block 292, the controller increases the maximum allowable current density to attain a realizable solution.

At decision block 284 the controller determines whether the current density exceeds the minimum allowable current density. If the controller determines that the calculated current density is in the acceptable range, then logical control proceeds to action block 286 where the controller completes its determination of the control parameters. If, however, the calculated current density is less than the minimum allowable current density, then control proceeds to action block 288.

At action block 288, the controller determines that a solution is not realizable and proceeds to action block 290. At action block 290, the controller either increases the maximum allowable scanned velocity or decreases the minimum allowable current density in order to obtain a realizable solution.

At action block 294, that follows from decision block 278, the sub-implant counter is incremented by one. After action block 294, logical flow proceeds to decision block 296. At decision block 296, if the sub-implant count is less than the maximum allowable sub-implant count, then control proceeds to block 274. If the current sub-implant count exceeds the maximum allowable sub-implant count, then control proceeds to action block 298. At action block 298 the controller has determined that a solution is not realizable and control proceeds to action block 300. At action block 300 the controller either increases the maximum allowable sub-implant count or decreases the scanned velocity in order to obtain a realizable solution.

Figure 13:
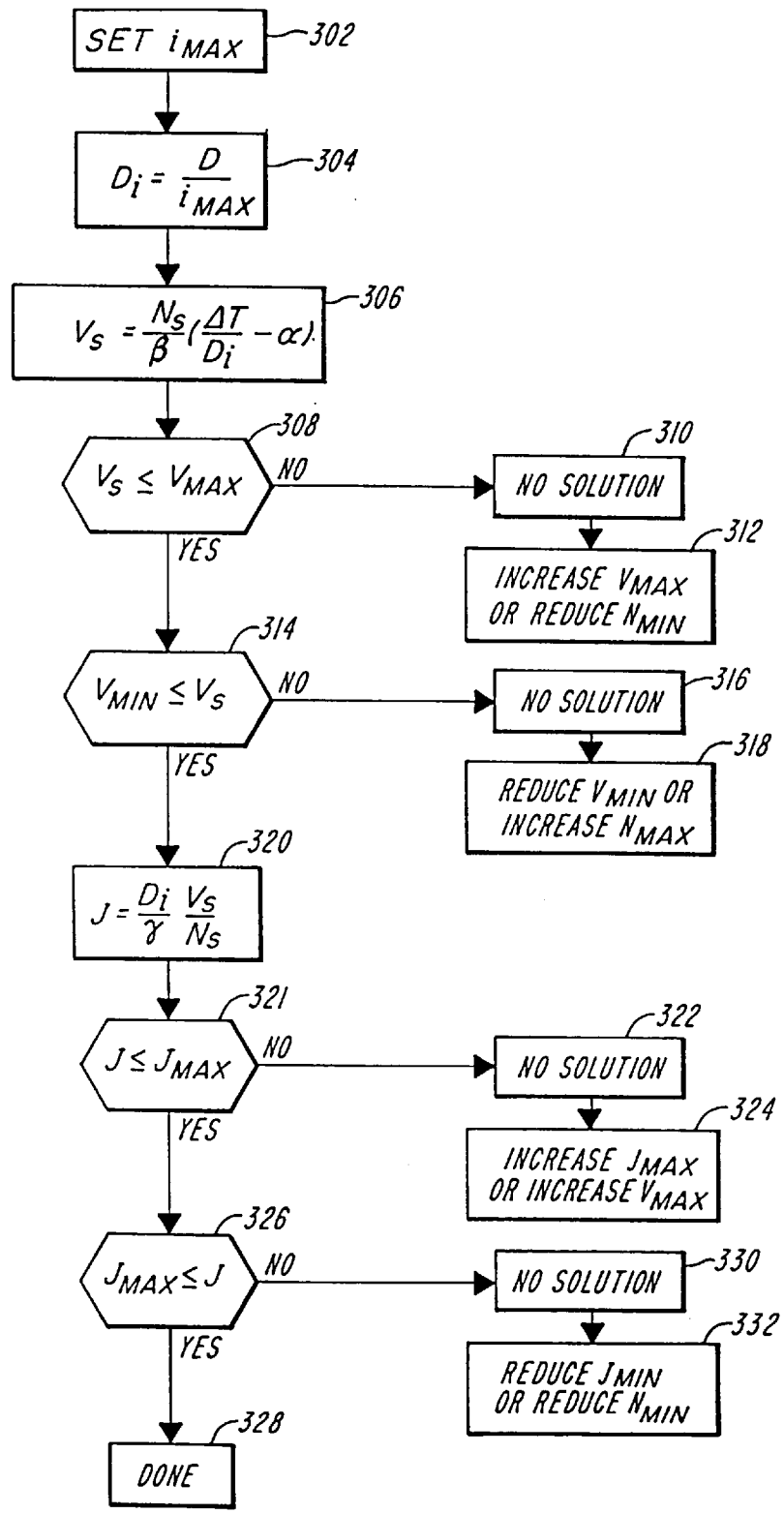

FIG. 13 illustrates a flow chart for controller 262 under the case where the number of implants is fixed by the user.

The controller begins its initialization at action block 302 where it sets the maximum allowable number of sub-implant. At block 304, the controller sets the current dosage to equal the maximum dose divided by the maximum number of sub implants. After action block 304, control proceeds to action block 306 where the scanned velocity is calculated. After the scanned velocity is calculated, control proceeds to decision block 308.

At decision block 308, the controller determines whether the scanned velocity is less than the maximum allowable scanned velocity. If the scanned velocity is within the acceptable range, then control proceeds to decision block 314. If the scanned velocity exceeds the maximum allowable scanned velocity, then control proceeds to action block 310 and 312. At action block 312, the controller has determined that a solution is not realizable and as a result either increases the maximum allowable scanned velocity or reduces the minimum number of scans allowable in order to reach a realizable solution.

At decision block 314, the controller determines whether the scanned velocity exceeds the minimum allowable scanned velocity. If the scanned velocity does exceed the minimum allowable scanned velocity, then control proceeds to action block 320. Otherwise control proceeds to action blocks 316 and 318. At action block 318, the controller has determined that a solution is not realizable and accordingly either reduces the minimum allowable scanned velocity or increases the maximum number of sub implants in order to reach a realizable solution.

At action block 320, the current density is calculated in accordance with EQ. 2. After action block 320, control proceeds to decision block 321.

At decision block 321, the controller determines whether the calculated current density is less than the maximum allowable current density. If the current density is within the acceptable range, then control proceeds to decision block 326. If the calculated current density exceeds the maximum allowable current density, then control proceeds to action block 322.

At action block 322, the controller has determined that a solution is not realizable given the parameters thus far. At action block 324 the controller either increases the maximum allowable current density or increases the maximum number of doses to create a realizable solution.

At decision block 326, the controller determines whether the calculated current density exceeds the minimum allowable current density. If the calculated current density does not exceed the minimum allowed current density, then control proceeds to action blocks 330 and 332. At action block 330, the controller has determined that a solution is not realizable and control proceeds to action block 332. At action block 332 the controller either reduces the minimum allowable current density or reduces the minimum number of allowable implants to reach a realizable solution.

At action block 328, the controller 262 determines it has reached a realizable solution. Accordingly, the controller implements the implantation process given the determined parameters.

Figure 14:
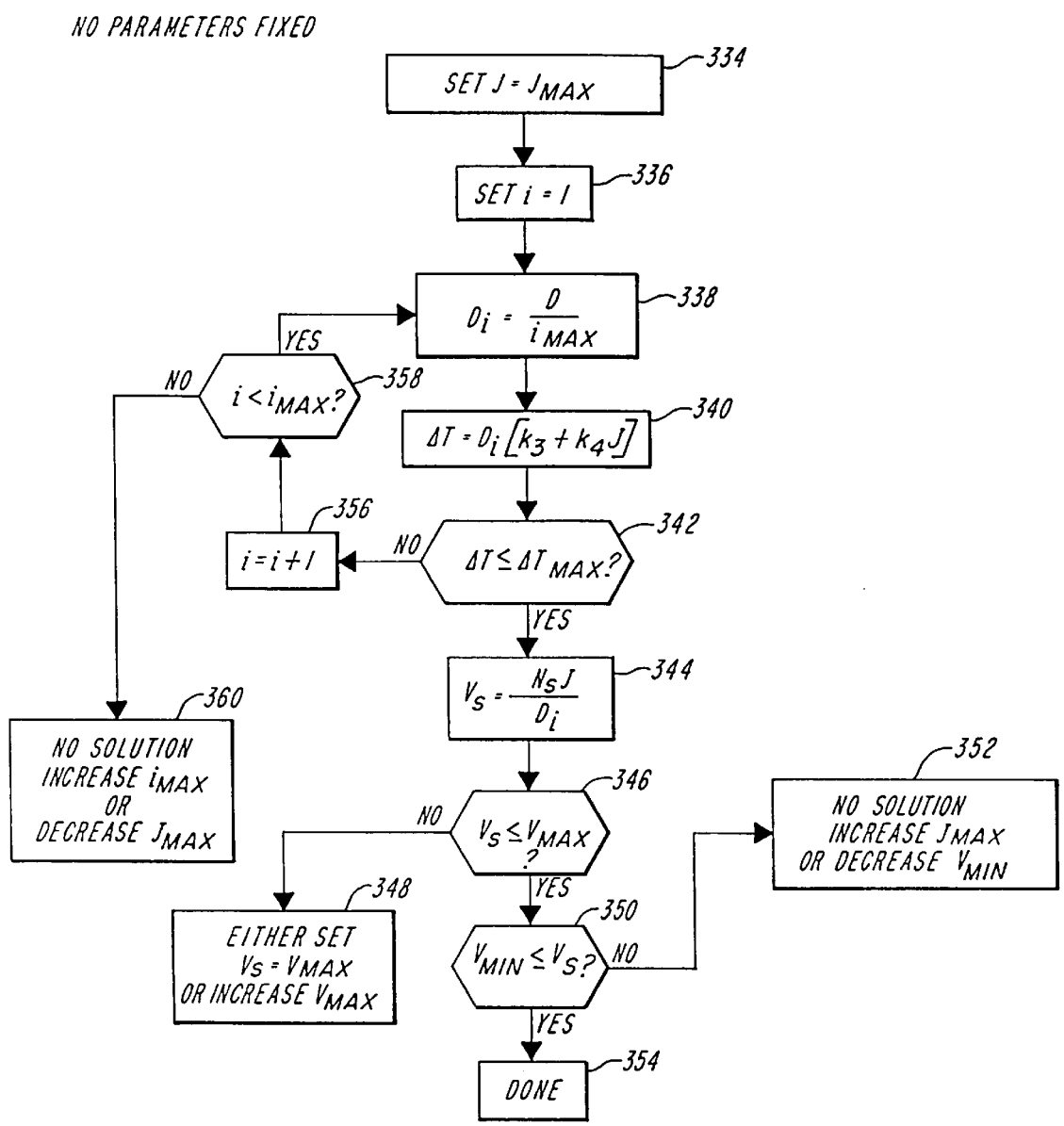

FIG. 14 illustrates a flow chart for controller 262 under the case where no parameters are fixed by the user, but the current density is initialized to the maximum allowable value.

At action block 334, the controller sets the current density to the maximum allowable current density. At action block 336, the controller sets the sub implant counter to 1. At action block 338, the sub dose is set to equal the total dosage divided by the maximum number of sub-implants. At action block 340 the workpiece temperature rise is calculated in accordance with EQ. 5 as described above. After action block 340, control proceeds to decision block 342.

At decision block 342, the controller determines whether the change in workpiece temperature rise is less than the maximum allowable temperature rise with a workpiece. If the temperature rise is not within the allowed range, then control proceeds to action block 356. If the temperature is within the allowed temperature range, then control proceeds to action block 344.

At action block 356, the sub-implant counter is incremented and control proceeds to decision block 358.

At decision block 358, if the counter is less than the maximum allowable number of counts, then control proceeds to action block 338. If, however, the count exceeds the maximum allowable number of counts, then control proceeds to action block 360.

At action block 360, the controller determines that a solution is not realizable given the current parameters. As a result, the controller either increases the maximum allowable number of sub-implants or decreases the maximum allowable current density, such that a solution is realizable.

At action block 344, the controller determines the scanned speed in accordance with EQ. 2. After action block 344, control proceeds to decision block 346. At decision block 346, the controller determines whether the scanned velocity is less than the maximum allowable scanned velocity. If the scanned velocity is within the acceptable range, then control proceeds to decision block 350. Otherwise, control proceeds to action block 348.

At action block 348, the controller either sets the scanned velocity to the maximum allowable scanned velocity or increases the maximum allowable scanned velocity to obtain a realizable solution for the implantation process.

At decision block 350, the controller determines whether the scanned velocity exceeds the minimum allowable scanned velocity. If the scanned velocity is less than the minimum allowable velocity, then control proceeds to action block 352. Otherwise, control proceeds to acting block 354.

At action block 352, the controller has determined that a solution is not realizable and accordingly either increases the maximum allowable current density or decreases the minimum allowable scanned velocity to obtain a realizable solution.

At action block 354, the controller has determined a realizable solution. Accordingly, the controller implements the implantation process given the determined parameters.

Figure 15:
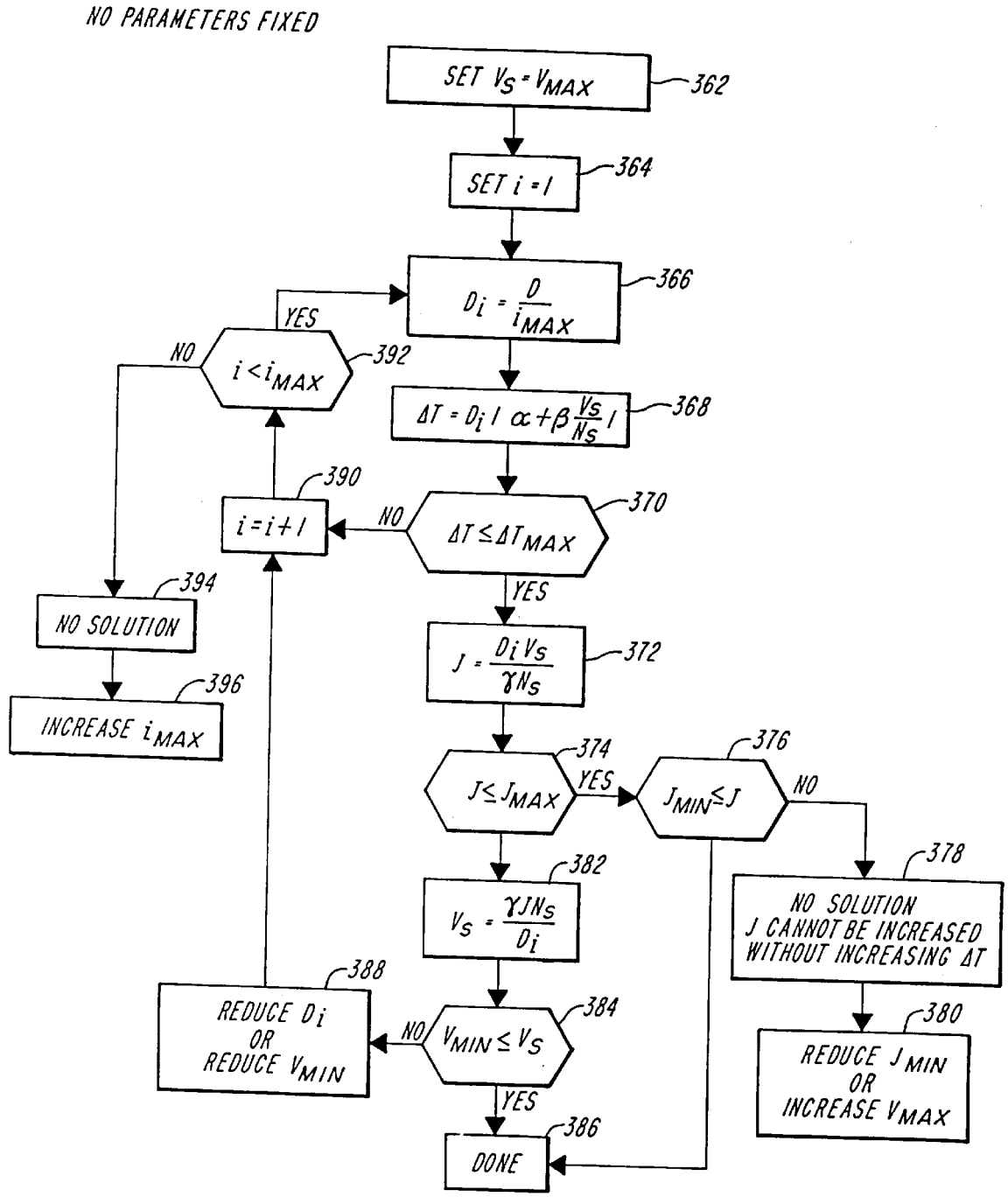

FIG. 15 illustrates a flow chart for controller 262 under the case where no parameters are fixed by the user, but the scan speed is initialized to the maximum allowable value.

At action block 362, the controller sets the scanned velocity equal to the maximum allowable scanned velocity. After which the controller sets the sub-implant counter to 1, at action block 364. At action block 366, the controller sets the sub dosage equal to the total dose divided by the maximum allowable sub-implant count. At action block 368, the controller determines the workpiece temperature rise based upon EQ. 3. After action block 368, logical flow proceeds to decision block 370.

At decision block 370, the controller determines whether the workpiece temperature rise is less than the maximum allowable workpiece temperature rise. If the workpiece temperature rise exceeds the maximum allowed temperature rise, then control proceeds to action block 390. Otherwise, when the temperature rise is less than the maximum allowable temperature, control proceeds to action block 372.

At action block 372, the controller calculates the current density based upon EQ. 2. After action block 372, control proceeds to decision block 374. At decision block 374, the controller determines whether the current density is less than the maximum allowable current density. If the current density is less than the maximum allowable current density then control proceeds to decision block 376, otherwise control proceeds to action block 382.

At decision block 376, the controller determines whether the calculated current density exceeds the minimum allowable current density. If the calculated current density is within the acceptable range, then control proceeds to action block 386. If the current density is less than the minimum allowable current density, then control proceeds to action block 378.

At action block 378, the controller has determined that a solution given the current parameters is not realizable. Control proceeds to block 380, where the controller reduces the minimum allowable current density or increases the maximum allowable scanned velocity to obtain a realizable solution.

At action block 382, which proceeds from decision block 374, the controller calculates the scanned velocity. The controller calculates the scanned velocity based upon EQ. 2. After calculating the scanned velocity, logical flow proceeds to decision block 384. At decision block 384, the controller 262 determines whether the scanned velocity exceeds the minimum allowable scanned velocity. If the scanned velocity is within the acceptable range, control then proceeds to action block 386. Otherwise, control proceeds to action block 388.

At action block 386, the controller has obtained an acceptable and realizable solution. Accordingly, the controller executes the ion implantation process given the determined parameters.

At action block 388, the controller has determined that the solution is not realizable and accordingly reduces either the sub dosage or reduces the scanned velocity in order to obtain a realizable solution. After action block 388, control proceeds to action block 390.

At action block 390, the sub-implant counter is incremented and control proceeds to decision block 392.

At decision block 392, if the counter is less than the maximum allowable number of counts, then control proceeds to action block 366. If, however, the count exceeds the maximum allowable number of counts, then control proceeds to action block 394.

At action block 394, the controller determines that a solution is not realizable given the current parameters. As a result, control proceeds to action block 396. At action block 396 the controller increases the maximum allowable number of sub-implants, such that a solution is realizable.

FIG. 16 illustrates, in accordance with a further aspect of the invention, a psuedocode listing for implementing the controller 262. The system shown in FIG. 16 differs from the implementation shown in FIGS. 11–15.

The pseudocode listing indicates that the controller begins its initialization process by reading a set of variables and by calculating both the minimum dose per sub-implant of the workpiece and the maximum dose per sub-implant of the workpiece. Equations utilized in the pseudocode listing include, Sub dose $$D_n = \frac{JN_sf}{V_{scan}q} \quad \text{(EQ. 6)}$$

Substrate Temperature Rise during sub implant $$\text{delta\_}T = \frac{D_n Eq}{C_g f}\left[1 + \frac{\text{alpha } R_g C_g V_{scan}}{N_s W}\right] \quad \text{(EQ. 7)}$$

Solving for Vscan:

$$V_{scan} = \frac{W N_s}{\text{alpha } R_g C_g}\left[\frac{f C_g \text{ delta\_}T}{D_n Eq} - 1\right] \quad \text{(EQ. 8)}$$

Terms identified in further lines of the pseudocode include,

| | |
|---|---|
| W | beam width (cm) |
| D | required total dose (ions/cm$^2$) |
| Dn | sub dose (ions/cm$^2$) |
| Jmax, Jmin | maximum, minimum linear current density (A/cm) |
| Vmax, Vmin | maximum, minimum scan velocity (cm/s) |
| Nmax, Nmin | maximum, minimum number of sub implants |
| 1 | species fraction/charged fraction |
| E | implant energy (V) |
| Ns | number of scans per sub implant (usually 2) |
| DT | maximum allowable substrate temperature rise (C.) |
| Cg | glass area thermal capacity (Joules/C./cm$^2$) |
| Rg | glass area thermal impedance (cm$^2$C./Watt) |
| TAOg | glass thermal time constant (sec) (Rg * Cg) |
| alpha | 0.373 (0.5 if unmodified RC thermal model.) |
| q | 1.6e-19 (electron charge in Coulombs) |
| Vscan | scan speed (cm/sec) |

After the initialization phase, the controller 262 calculates the best throughput value for each number of sub-implants between the minimum number of sub-implants and the maximum number of sub-implants. Based on the controller's determination as to the throughput values for the number of sub-implants, the controller then determines the best combination of primary control settings. After determining the preferred combination of primary control settings, the controller 262 begins processing workpieces with the preferred combination of settings.

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

Having described the invention, what is claimed as new and desired to be secured by letters patent is:

1. An apparatus for treating a workpiece by directing an ion beam at the workpiece, the apparatus comprising
    an ion source for producing the ion beam extending along a beam path,
    an electrode assembly for directing the ion beam towards the workpiece,
    a platform mounting the workpiece, the platform being oriented such that a first portion of the ion beam treats the workpiece and a second portion of the ion beam extends beyond the edge of the workpiece, and
    beam measuring means adapted for measuring parameters of the second portion of the ion beam contemporaneous with the treatment of the workpiece.

2. An apparatus according to claim 1, further including means for producing a ribbon beam having a high aspect ratio and extending along an axis of elongation.

3. An apparatus according to claim 2, wherein the beam measuring means includes a faraday slot positioned in the beam path for measuring current density, the faraday slot extending along a path substantially transverse to the axis of elongation.

4. An apparatus according to claim 3, wherein the length of the faraday slot along the path exceeds the width of the ribbon beam, such that the faraday slot measures the total current density of the ribbon beam along a strip traversing the entire width of the ribbon beam.

5. An apparatus according to claim 1, wherein the platform is moveable and the beam measuring means is stationary such that the workpiece progresses through the beam path.

6. An apparatus according to claim 5, wherein the platform includes a pickup arm supporting the workpiece, the pickup arm being extendible through the beam path.

7. An apparatus according to claim 5, wherein the platform includes:
    a pair of substantially parallel rails, and
    a table moveably mounted to the rails.

8. An apparatus according to claim 5, wherein the platform includes:
    a supporting axle, and
    a wheel moveably mounted to the axle.

9. An apparatus according to claim 5, wherein the platform includes:
    a pair of substantially parallel rollers, and
    an endless belt moveably mounted to the rollers.

10. An apparatus according to claim 5, wherein the platform further includes a motor for moving the workpiece through the ion beam at a variable velocity.

11. An apparatus according to claim 10, further including a motor controller coupled with the beam measuring means and with the motor, the motor controller generating control signals to the motor in response to the measured parameters of the ion beam.

12. An apparatus according to claim 1, wherein the beam measuring means includes a neutral beam detector positioned in the beam path for measuring neutral atoms in the ion beam.

13. An apparatus according to claim 1, wherein the beam measuring means includes a mass analyzer positioned in the beam path for measuring the mass of particles in the ion beam.

14. An apparatus according to claim 1, wherein the beam measuring means includes a faraday detector positioned in the beam path for measuring current density.

15. An apparatus according to claim 14, wherein the faraday detector is permanently positioned beyond the edge of the workpiece.

16. An apparatus according to claim 14, wherein the faraday detector is a plurality of faraday cups forming an array for measuring changes in the current density along the length of the array.

17. An apparatus according to claim 1, wherein the beam measuring means includes a detector positioned in the beam path for measuring parameters of the first portion of the ion beam, the detector being selected from the group consisting of neutral beam detectors, mass analyzers, and faraday detectors.

18. An apparatus according to claim 17, further comprising a moveable support assembly mounting the detector such that the detector is moveable through the first and second portions of the ion beam.

19. An apparatus according to claim 17, wherein the detector is a plurality of faraday detectors forming an array for measuring changes in the current density of the ion beam along the length of the array.

20. An apparatus according to claim 1, further comprising a parametric controller coupled with the beam measuring means for generating a set of controls signals in response to the measured parameters.

21. An apparatus according to claim 20 wherein the parametric controller is coupled with the ion source and the set of control signals includes a power signal for varying an excitation power to the ion source.

22. An apparatus according to claim 20 wherein the parametric controller is coupled with the ion source and the set of control signals includes a flow signal for varying the flow of ionizable matter into the ion source.

23. An apparatus according to claim 20 wherein the parametric controller is coupled with the electrode assembly and the set of control signals includes an electrode signal for varying the voltages applied to the electrode assembly.

24. An apparatus for treating a workpiece by directing ions at the workpiece, the apparatus comprising
an ion source for producing an ion stream in the form of a ribbon beam,
an electrode assembly for directing the ribbon beam towards the workpiece,
a platform mounting the workpiece, the platform being oriented such that a first portion of the ribbon beam treats the workpiece and a second portion of the ribbon beam extends beyond the edge of the workpiece,
a motor-coupled with the platform for moving the workpiece through the ribbon beam,
beam measuring means adapted for measuring parameters of the second portion of the ribbon beam contemporaneous with the treatment of the workpiece, and
a motor controller coupled with the beam measuring means and the motor, the motor controller generating control signals to the motor in response to the measured parameters of the ribbon beam.

25. A method for treating a workpiece with a directed ion beam, the method comprising the steps of
producing an ion beam extending along a beam path,
directing the ion beam towards the workpiece such that a first portion of the ion beam treats the workpiece and a second portion of the ion beam extends beyond the edge of the workpiece,
measuring parameters of the second portion of the ion beam contemporaneous with the treatment of the workpiece, and
adjusting the treatment of the workpiece based on the measured parameters.

26. A method according to claim 25 wherein the producing step generates an ion stream in the shape of a ribbon beam having a high aspect ratio and extending along an axis of elongation.

27. A method according to claim 26, wherein the measuring step includes measuring the total current density along a strip traversing the entire width of the ribbon beam.

28. A method according to claim 26, wherein the measuring step includes obtaining discrete measurements of current density along a path substantially transverse to the axis of elongation.

29. A method according to claim 25, wherein the measuring step includes measuring neutral atoms in at least one of the first and the second portions of the ion beam.

30. A method according to claim 25, wherein the measuring step includes measuring the mass of particles in at least one of the first and the second portions of the ion beam.

31. A method according to claim 25, wherein the measuring step includes measuring the current density in at least one of the first and the second portions of the ion beam.

32. A method according to claim 25, further comprising the step of measuring the parameters of the first portion of the ion beam prior to the step of directing the ion beam towards the workpiece.

33. A method according to claim 25, wherein the adjusting step includes moving the workpiece through the beam path at a velocity based on the measured parameters.

34. A method according to claim 33, wherein the adjusting step further includes changing the velocity of the moving workpiece during treatment of the workpiece.

35. A method according to claim 25, wherein the adjusting step includes varying an excitation power to the ion source based on the measured parameters.

36. A method according to claim 25, wherein the adjusting step includes varying a flow of ionizable matter to the ion source based on the measured parameters.

37. A method according to claim 25, wherein the adjusting step includes varying a voltage applied to an electrode assembly based on the measured parameters.

* * * * *

UNITED STATES PATENT AND TRADEMARK OFFICE
CERTIFICATE OF CORRECTION

PATENT NO. : 5,811,823
DATED : September 22, 1998
INVENTOR(S) : Blake, Julian G. et al.

It is certified that error appears in the above-identified patent and that said Letters Patent is hereby corrected as shown below:

At column 3, line 14, replace "...goal of most modem..." with --...goal of most modern...--;

At column 3, line 59, replace "...includes platform..." with --...includes a platform...--;

At column 7, line 24, replace "...having arc platform..." with --...having a circular platform...--;

At column 7, lines 10, 12, 16, 20, 24, 28 and 31, replace "...cross sectional..." with --cross-sectional--;

At column 14, line 2, replace "...a voltage signal 118..." with --a voltage1 signal 118--;

UNITED STATES PATENT AND TRADEMARK OFFICE
CERTIFICATE OF CORRECTION

PATENT NO. : 5,811,823
DATED : September 22, 1998
INVENTOR(S) : Blake, Julian G. et al.

It is certified that error appears in the above-identified patent and that said Letters Patent is hereby corrected as shown below:

At column 19, line 36, replace "...to acting block 354..." with --to action block 354--;

At column 23, line 28, replace "...a motor-coupled..." with --a motor coupled--.

Signed and Sealed this

Twenty-eighth Day of March, 2000

Attest:

Q. TODD DICKINSON

*Attesting Officer*  *Commissioner of Patents and Trademarks*